United States Patent
Kudo et al.

(10) Patent No.: US 8,172,949 B2
(45) Date of Patent: May 8, 2012

(54) SUBSTRATE PROCESSING APPARATUS, PROGRAM FOR PERFORMING OPERATION AND CONTROL METHOD THEREOF, AND COMPUTER READABLE STORAGE MEDIUM STORING THE PROGRAM

(75) Inventors: Tomoyuki Kudo, Miyagi-gun (JP); Jun Ozawa, Nirasaki (JP); Hiroshi Nakamura, Nirasaki (JP); Kazunori Kazama, Nirasaki (JP); Tsuyoshi Moriya, Nirasaki (JP); Hiroyuki Nakayama, Nirasaki (JP); Hiroshi Nagaike, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/718,699

(22) Filed: Mar. 5, 2010

(65) Prior Publication Data

US 2010/0154995 A1 Jun. 24, 2010

Related U.S. Application Data

(62) Division of application No. 11/254,668, filed on Oct. 21, 2005, now Pat. No. 7,756,599.

(60) Provisional application No. 60/635,945, filed on Dec. 15, 2004.

(30) Foreign Application Priority Data

Oct. 28, 2004 (JP) ................................. 2004-313475

(51) Int. Cl.
  *C23C 16/00* (2006.01)
  *C23F 1/00* (2006.01)
  *B65G 21/677* (2006.01)
  *H01L 21/306* (2006.01)
(52) U.S. Cl. ................... 118/719; 118/663; 156/345.24; 156/345.31; 156/345.32; 414/217; 414/935; 414/939

(58) Field of Classification Search ........................ None
See application file for complete search history.

(56) References Cited

U.S. PATENT DOCUMENTS

| 5,979,480 | A | * | 11/1999 | Hoshiko | 137/14 |
| 6,039,770 | A | * | 3/2000 | Yang et al. | 29/25.01 |
| 6,154,284 | A | * | 11/2000 | McAndrew et al. | 356/437 |
| 6,323,463 | B1 | | 11/2001 | Davis et al. | |
| 6,843,809 | B2 | * | 1/2005 | Park | 29/25.01 |

FOREIGN PATENT DOCUMENTS

| JP | 63-157870 | 6/1988 |
| JP | 3-87386 | 4/1991 |
| JP | 5-74746 | 3/1993 |
| JP | 7-211761 | 8/1995 |
| JP | 7-228985 | 8/1995 |
| JP | 9-298137 | 11/1997 |
| JP | 2003-86578 | 3/2003 |

* cited by examiner

*Primary Examiner* — Karla Moore
(74) *Attorney, Agent, or Firm* — Oblon, Spivak, McClelland, Maier & Neustadt, L.L.P.

(57) ABSTRACT

A computer readable storage medium storing a program for performing an operation method of a substrate processing apparatus is provided. The operation method includes the steps of introducing a nonreactive gas into the vacuum preparation chamber before the gate valve is opened while the substrate is transferred between the vacuum preparation chamber of the vacuum processing unit and the transfer unit, stopping introducing the nonreactive gas when an inner pressure of the vacuum preparation chamber becomes same as an atmospheric pressure, starting an evacuation process of the corrosive gas in the vacuum preparation chamber and then opening to atmosphere performed by letting the vacuum preparation chamber communicate with an atmosphere, and opening the gate valve after the step of opening to atmosphere.

7 Claims, 18 Drawing Sheets

SUBSTRATE PROCESSING APPARATUS, PROGRAM FOR PERFORMING OPERATION AND CONTROL METHOD THEREOF, AND COMPUTER READABLE STORAGE MEDIUM STORING THE PROGRAM

CROSS-REFERENCE TO RELATED APPLICATIONS

This application is a divisional of U.S. patent application Ser. No. 11/254,668, filed Oct. 21, 2005, which claims priority to Japanese Patent Application No. 2004-313475, filed Oct. 28, 2004 and U.S. Provisional Application No. 60/635,945, filed Dec. 15, 2004. The entire contents of these applications are hereby incorporated by reference.

FIELD OF THE INVENTION

The present invention relates to a substrate processing apparatus, a program for performing operation and control method thereof, and a computer readable storage medium for storing the program.

BACKGROUND OF THE INVENTION

A substrate processing apparatus includes a plurality of chambers connected with each other. Among those chambers, there are a transfer chamber, provided in a transfer unit, for transferring a substrate to be processed, e.g., a semiconductor wafer (hereinafter, simply referred to as a "wafer"), between the transfer chamber under the atmospheric pressure and the outside; a vacuum processing chamber for performing a specified process such as etching or film forming process on the wafer; and a vacuum preparation chamber (e.g., load-lock chamber) which is disposed between the vacuum processing chamber and the transfer chamber to be connected with them. The chambers are sealed and connected to each other via gate valves.

In the substrate processing apparatus, the wafer is transferred between those chambers and processed in the vacuum processing chamber. Generally, the wafer is transferred in the substrate processing apparatus including those chambers as follows. For example, the wafer is loaded into the transfer chamber from the outside. Further, the wafer is then loaded into the vacuum processing chamber through the vacuum preparation chamber. Then, a processing such as etching or film forming process is carried out on the wafer in the vacuum processing chamber by using a specified processing gas. When the processing is finished in the vacuum processing chamber, the wafer is transferred back to the transfer chamber via the vacuum preparation chamber. In a wafer transfer between the vacuum preparation chamber and the transfer chamber, once the pressure in the vacuum preparation chamber reaches a specified pressure, for example, by opening the chamber to the atmosphere, the gate valve between the chambers is opened and the wafer is transferred between the vacuum preparation chamber and the transfer chamber. Further, in a wafer transfer between the vacuum preparation chamber and the vacuum chamber, once the vacuum preparation chamber reaches to a predetermined pressure, for example, by vacuum processing, the gate valve between the chambers is opened and the wafer is transferred between the vacuum preparation chamber and the vacuum processing chamber. In other words, when the wafer is transferred between the chambers, each chamber is controlled to set its pressure at a specified value in order to reduce a pressure difference between the chambers.

However, depending on a pressure condition of each chamber, when the gate valve is opened between the chambers, there give rise to various problems such as a processing gas remaining in the vacuum processing chamber flowing backward; contaminant such as water being introduced from the transfer chamber; and particles (deposits, dust and the like) being swirled up in the chambers. Accordingly, the wafer may be contaminated by the particles or contaminant. Further, when a corrosive processing gas flows backward into another chamber, the components in the chamber may be corroded.

Thus, conventionally, before the gate valve is opened, a pressure in the chamber is controlled in many ways. For example, in case that the vacuum preparation chamber is opened to the atmosphere when the gate valve between the transfer chamber and the vacuum preparation chamber is opened, the vacuum preparation chamber is evacuated while supplying a purge gas such as $N_2$ gas thereto for the purpose of removing the particles present in the vacuum preparation chamber in advance (see, e.g., Japanese Patent Laid-open Publication No. H3-087386).

Further, in a so-called cluster tool type substrate processing apparatus, wherein a plurality of vacuum processing chambers are connected to a common transfer chamber and a vacuum preparation chamber (load-lock chamber) is connected to the common transfer chamber, when a gate valve between the common transfer chamber and one of the vacuum processing chambers or between the common transfer chamber and the load-lock chamber is opened, a pressure of the common transfer chamber is made slightly higher than that of the vacuum processing chamber or the load-lock chamber by supplying a purge gas such as $N_2$ gas to the common transfer chamber, thereby forming a gas flow from the common transfer chamber to the vacuum processing chamber or the load-lock chamber. Accordingly, a processing gas or contaminant such as water is prevented from flowing into the common transfer chamber (see, e.g., Japanese Patent Laid-open Publication No. H7-211761)

However, in the aforementioned conventional technology, in order to prevent the backflow of the processing gas and cross contamination and to remove the particles, the pressure of the relevant chamber is controlled by supplying the purge gas such as $N_2$ gas to thereby cause a pressure difference between the chambers.

Depending on the pressure difference between the chambers, a gas flow is generated when the gate valve is opened, and particles are swirled up along the flow in the chamber. Particularly, when the pressure difference between the chambers is large, a shock wave (very strong pressure wave which is transmitted at a supersonic speed when compressible fluid flows at a high speed) is generated and along the propagation of the shock wave, the particles will be swirled up in the chamber.

Thus, by slightly reducing the pressure difference between the chambers, one may expect to prevent the swirling up of particles. But, recently, airtightness of the chambers is further enhanced due to improvement in sealing technology. Accordingly, in the conventional sequence of pressure control, the inner pressure of the chamber becomes needlessly high due to, e.g., the introduction of the purge gas, thereby needlessly increasing an actual pressure difference between chambers.

Further, it may be possible to accurately control the pressure of each chamber such that the pressure difference between chambers does not become excessively high by precisely measuring the pressures of all chambers. However, in order to accurately control the pressure, an expensive pressure gauge or a control apparatus is required to thereby increase the cost and, further, it is not practical because the sequence of the pressure control becomes too complicated.

Further, Japanese Patent Laid-open Publication No. H7-211761 discloses that a bypass capable of being opened or closed is provided between the chambers and the bypass is opened before the gate valve is opened to reduce the pressure difference between the chambers, whereby forming a rapid flow of gas (pressure wave) is prevented when the gate valve is opened. However, when the bypass is opened, depending on the pressure difference between the chambers, a shock wave may be generated even before the gate valve is opened and propagate into the chamber, thereby making particles be swirled up.

SUMMARY OF THE INVENTION

It is, therefore, an object of the present invention to provide a substrate processing apparatus, a program for performing operation and control method thereof, and a computer readable storage medium for storing the program capable of effectively preventing particles from being swirled up in a chamber by suppressing a shock wave or convection caused when the gate valve is opened between chambers by means of a simple configuration.

To achieve the object, in accordance with an aspect of the present invention, there is provided a computer readable storage medium storing a program for performing an operation method of a substrate processing apparatus which includes a transfer unit for transferring a substrate to be processed between a transfer chamber and the outside; and at least one vacuum processing unit, connected to the transfer unit, having a vacuum preparation chamber connected to the transfer unit via a gate valve and at least one vacuum processing chamber for performing a process on the substrate loaded therein via the vacuum preparation chamber by using a corrosive gas as a processing gas, the method including the steps of introducing a nonreactive gas into the vacuum preparation chamber before the gate valve is opened while the substrate is transferred between the vacuum preparation chamber of the vacuum processing unit and the transfer unit; stopping introducing the nonreactive gas when an inner pressure of the vacuum preparation chamber becomes same as an atmospheric pressure, starting an evacuation process of the corrosive gas in the vacuum preparation chamber and then opening to atmosphere performed by letting the vacuum preparation chamber communicate with an atmosphere; and opening the gate valve after the step of opening to atmosphere.

To achieve the object, in accordance with another aspect of the present invention, there is provided a computer readable storage medium storing a program for performing a control method of a substrate processing apparatus which includes a transfer unit for transferring a substrate to be processed between a transfer chamber and the outside; and at least one vacuum processing unit, connected to the transfer unit, having a vacuum preparation chamber connected to the transfer unit via a gate valve and at least one vacuum processing chamber for performing a process on the substrate loaded therein via the vacuum preparation chamber by using a corrosive gas as a processing gas, wherein the vacuum preparation chamber has a nonreactive gas introducing unit, a corrosive gas evacuation unit, an opening-to-atmosphere unit and the like, the method including the steps of introducing a nonreactive gas into the vacuum preparation chamber by controlling a gas introduction valve of the nonreactive gas introducing unit before the gate valve is opened while the substrate is transferred between the vacuum preparation chamber of the vacuum processing unit and the transfer unit; stopping introducing the nonreactive gas by controlling the gas introduction valve of the nonreactive gas introducing unit when an atmospheric pressure state detecting unit provided in the vacuum preparation chamber determines that an inner pressure of the vacuum preparation chamber becomes same as an atmospheric pressure, starting an evacuation process of the corrosive gas in the vacuum preparation chamber by controlling an evacuation valve of the corrosive gas evacuation unit and then opening to atmosphere performed by letting the vacuum preparation chamber communicate with an atmosphere by controlling an opening-to-atmosphere valve of the opening-to-atmosphere unit; and opening the gate valve by controlling it after the step of opening to atmosphere.

To achieve the object, in accordance with still another aspect of the present invention, there is provided a substrate processing apparatus including a transfer unit for transferring a substrate to be processed between a transfer chamber and the outside; at least one vacuum processing unit connected to the transfer unit; at least one vacuum preparation chamber provided in the vacuum processing unit and connected to the transfer unit via a gate valve, having a nonreactive gas introducing unit, a corrosive gas evacuation unit, an opening-to-atmosphere unit and the like; at least one vacuum processing chamber, provided in the vacuum processing unit, for performing a process on the substrate loaded therein via the vacuum preparation chamber by using a corrosive gas as a processing gas; and a controller for introducing a nonreactive gas into the vacuum preparation chamber by controlling a gas introduction valve of the nonreactive gas introducing unit before the gate valve is opened while the substrate is transferred between the vacuum preparation chamber of the vacuum processing unit and the transfer unit; stopping introducing the nonreactive gas by controlling the gas introduction valve of the nonreactive gas introducing unit when it is determined that an inner pressure of the vacuum preparation chamber becomes same as an atmospheric pressure, starting an evacuation process of the corrosive gas in the vacuum preparation chamber by controlling an evacuation valve of the corrosive gas evacuation unit and then opening to atmosphere performed by letting the vacuum preparation chamber communicate with an atmosphere by controlling an opening-to-atmosphere valve of the opening-to-atmosphere unit; and opening the gate valve by controlling it after the step of opening to atmosphere.

To achieve the object, in accordance with still another aspect of the present invention, there is provided a program for performing a control method of a substrate processing apparatus which includes a transfer unit for transferring a substrate to be processed between a transfer chamber and the outside; and at least one vacuum processing unit, connected to the transfer unit, having a vacuum preparation chamber connected to the transfer unit via a gate valve and at least one vacuum processing chamber for performing a process on the substrate loaded therein via the vacuum preparation chamber by using a corrosive gas as a processing gas, wherein the vacuum preparation chamber has a nonreactive gas introducing unit, a corrosive gas evacuation unit, an opening-to-atmosphere unit and the like, the method including the steps of opening a gas introduction valve of the nonreactive gas introducing unit before the gate valve is opened when the substrate is transferred between the vacuum preparation chamber of the vacuum processing unit and the transfer unit; closing the gas introduction valve of the nonreactive gas introducing unit when an atmospheric pressure state detecting unit provided in the vacuum preparation chamber determines that an inner pressure of the vacuum preparation chamber becomes same as an atmospheric pressure, simultaneously opening an evacuation valve of the corrosive gas evacuation unit and then opening to atmosphere performed by opening an opening-to-atmosphere valve of the opening-to-atmosphere unit; and opening the gate valve.

In accordance with the computer readable storage medium, the apparatus and the program of the present invention, even though a nonreactive gas is introduced into the vacuum preparation chamber, the introduction of the nonreactive gas can be stopped at an early stage, thereby preventing the pressure of the vacuum preparation chamber from becoming needlessly increased. Further, an evacuation of corrosive gas in the vacuum preparation chamber can be started at an early stage, whereby corrosive gas and the like remaining in the vacuum preparation chamber can be evacuated in advance before the gate valve is opened. Accordingly, although the opening-to-atmosphere valve is opened after that, the corrosive gas can be prevented from flowing into, e.g., the transfer chamber. Resultantly, it can be also prevented that, for example, parts of mechanisms in the transfer chamber are corroded. As described above, in accordance with the present invention, by simply configuring that the introduction of the nonreactive gas is stopped and, at the same time, the evacuation of the corrosive gas in the vacuum preparation chamber is started at an early stage, it can be prevented that the pressure of the vacuum preparation chamber becomes needlessly increased. Consequently, a shock wave or rapid convection can be prevented from occurring when the gate valve between the chambers is opened, thereby effectively preventing particles from being swirled up in the chamber.

Further, in the computer readable storage medium, timings of stopping introducing the nonreactive gas and starting the evacuation process of the corrosive gas can be freely set in the step of opening to atmosphere and, for example, they may be same as a timing when the inner pressure of the vacuum preparation chamber becomes same as the atmospheric pressure. Accordingly, by controlling timings of stopping introducing the nonreactive gas and starting the evacuation process of the corrosive gas, particles can be prevented from being swirled up due to a pressure difference between the vacuum preparation chamber and the transfer unit when the gate valve is opened. In accordance with the present invention, by simply configuring that timings of stopping introducing the nonreactive gas and starting the evacuation process of the corrosive gas are adjusted, it can be prevented that the pressure of the vacuum preparation chamber becomes needlessly increased. Consequently, a shock wave or rapid convection can be prevented from occurring when the gate valve between the chambers (in this case, between the vacuum preparation chamber and the transfer unit) is opened, thereby effectively preventing particles from being swirled up in the chamber.

Further, in the computer readable storage medium, the substrate processing apparatus further includes a backflow detecting unit for detecting a backflow in the evacuation process of the corrosive gas, and when the backflow is detected during the evacuation process by the backflow detecting unit after starting the evacuation process of the corrosive gas in the vacuum preparation chamber, preferably, an error process is performed if the backflow is not controlled within a specified time period and the error process is not performed if the backflow is controlled within a specified time period. Accordingly, although the backflow is detected momentarily, the error process is not conducted if the backflow becomes controlled within the specified time period. Thus, even though the evacuation valve is opened early before the gate valve is opened as in the present invention and the error process is closing the evacuation valve, for example, when the backflow occurs, it is possible to avoid a problem such as the one that the evacuation valve is closed just simply because a momentary backflow has occurred.

Further, in the substrate processing apparatus, a shock wave preventing mechanism for preventing a shock wave occurring depending on a pressure difference between the vacuum preparation chamber and the transfer unit may be provided therebetween. In addition, a shock wave preventing mechanism for preventing a shock wave occurring depending on a pressure difference between the vacuum preparation chamber and the vacuum processing chamber may be provided therebetween. The shock wave preventing mechanism includes a communication pipe for letting the vacuum preparation chamber communicate with the transfer unit or the vacuum processing chamber; a shock wave propagation preventing unit disposed in the communication pipe; and a communication pipe opening/closing valve disposed at one side of the shock wave propagation preventing unit, close to the vacuum preparation chamber having a higher pressure.

In the substrate processing apparatus provided with the shock wave preventing mechanism, the gate valve can be opened after, e.g., the communication pipe opening/closing valve is opened. Accordingly, even if there is the pressure difference between the vacuum preparation chamber and the transfer unit (or the vacuum processing chamber), the shock wave occurring when opening the communication pipe opening/closing valve remains in the communication pipe by the presence of the shock wave propagation preventing unit without propagating, thereby preventing the swirling up of particles is caused by a shock wave. Further, because the pressure difference between the vacuum preparation chamber and the transfer unit (or the vacuum processing chamber) is reduced by opening the communication pipe opening/closing valve, even though the gate valve is opened after that, a shock wave does not occur to thereby prevent the particles from being swirled up along the shock wave.

To achieve the object, in accordance with still another aspect of the present invention, there is provided a substrate processing apparatus including a plurality of chambers at least including a vacuum processing chamber for performing a process on a substrate to be processed by using a processing gas, wherein the substrate is transferred between the chambers; and a shock wave preventing mechanism for preventing a shock wave occurring depending on a pressure difference between chambers having at least a pressure difference among the plurality of chambers.

Further, the shock wave preventing mechanism includes a communication pipe for letting the chambers communicate with each other; a shock wave propagation preventing unit disposed in the communication pipe; and a communication pipe opening/closing valve disposed at one side of the shock wave propagation preventing unit, close to the vacuum preparation chamber having a higher pressure. Additionally, when the processing gas is a corrosive gas, the communication pipe may be provided with a communication pipe opening/closing valve also disposed at another side of the shock wave propagation preventing unit, close to the vacuum preparation chamber having a lower pressure, and a vacuum evacuation unit for vacuum processing the communication pipe, which is provided between the shock wave propagation preventing unit and the communication pipe opening/closing valve disposed at said another side of the shock wave propagation preventing unit.

To achieve the object, in accordance with still another aspect of the present invention, there is provided a computer readable storage medium storing a program for performing a control method of a substrate processing apparatus which includes a plurality of chambers at least including a vacuum processing chamber for performing a process on a substrate to be processed by using a processing gas, wherein the substrate is transferred between the chambers via a gate valve; and a shock wave preventing mechanism having a communication pipe for letting the chambers communicate with each other, a shock wave propagation preventing unit disposed in the communication pipe, and a communication pipe opening/closing valve disposed at one side of the shock wave propagation preventing unit, close to the vacuum preparation chamber having a higher pressure, wherein the gate valve is opened after opening the communication pipe opening/closing valve to make the chambers communicate with each other via the communication pipe.

In the substrate processing apparatus provided with the shock wave preventing mechanism, the gate valve is opened after, e.g., the communication pipe opening/closing valve is opened. Accordingly, even if there is the pressure difference between the chambers, the shock wave occurring when opening the communication pipe opening/closing valve remains in the communication pipe by the presence of the shock wave propagation preventing unit without propagating. Further, because the pressure difference between the chambers is reduced by opening the communication pipe opening/closing valve, even though the gate valve is opened after that, a shock wave does not occur. In accordance with the present invention, by simply configuring that the communication pipe is disposed between the chambers and, simultaneously, the shock wave propagation preventing unit is provided in the communication pipe, a shock wave or rapid convection can be prevented from occurring when the gate valve between the chambers is opened, thereby effectively preventing particles from being swirled up in the chamber.

To achieve the object, in accordance with still another aspect of the present invention, there is provided a computer readable storage medium storing a program for performing a control method of a substrate processing apparatus which includes a plurality of chambers at least including a vacuum processing chamber for performing a process on a substrate to be processed by using a processing gas, wherein the substrate is transferred between the chambers via a gate valve; and a shock wave preventing mechanism having a communication pipe for making the chambers communicate with each other, a shock wave propagation preventing unit disposed in the communication pipe, communication pipe opening/closing valves disposed at both sides of the shock wave propagation preventing unit, and a vacuum evacuation unit for vacuum processing the communication pipe, which is provided between the shock wave propagation preventing unit and a communication pipe opening/closing valve disposed close to the vacuum preparation chamber having a lower pressure, wherein the communication pipe is vacuum processed by the vacuum evacuation unit when both of the communication pipe opening/closing valves are closed before the gate valve is opened such that a pressure of the communication pipe is made lower than that of the chamber having a lower pressure, and the gate valve is opened after opening the communication pipe opening/closing valve close to the chamber having a lower pressure and then opening the communication pipe opening/closing valve close to the chamber having a higher pressure to let the chambers communicate with each other.

In accordance with the present invention, as described above, even if there is the pressure difference between the chambers, it is possible to prevent the particles from being swirled up along the shock wave occurring when opening the communication pipe opening/closing valve. For example, when the communication pipe opening/closing valve disposed close to the chamber having a lower pressure is opened, the pressure in the communication pipe is lower than that in the chamber having a lower pressure. Accordingly, a shock wave occurs in the communication pipe, and the shock wave remains in the communication pipe by the presence of the shock wave propagation preventing unit without propagating, thereby preventing the swirling up of particles. Further, although the communication pipe opening/closing valve disposed close to the chamber having a higher pressure is opened, a shock wave occurs in the communication pipe in the same way as in the above case, and the shock wave remains in the communication pipe by the presence of the shock wave propagation preventing unit without propagating, thereby preventing particles from being swirled up. Furthermore, since the pressure difference between the chambers is reduced by opening the communication pipe opening/closing valve, even though the gate valve is opened after that, a shock wave does not occur to thereby prevent the particles from being swirled up along the shock wave. Moreover, the communication pipe can be evacuated, whereby it is possible to prevent the communication pipe from being contaminated by a corrosive gas.

Further, in the computer readable storage medium, it waits until at least an extension time for end of opening to atmosphere elapses from when the vacuum preparation chamber is made to communicate with the atmosphere by the opening-to-atmosphere unit. When the extension time for end of opening to atmosphere has elapsed, if there is an instruction to open the gate valve, it is possible to open the gate valve according to the instruction.

In this case, it may wait until the extension time for end of opening to atmosphere elapses after the regulation delay time has elapsed from when the vacuum preparation chamber is made to communicate with the atmosphere by the opening-to-atmosphere unit. Further, if there is an instruction to open the gate valve during after the regulation delay time, from that point, it may wait until the extension time for end of opening to atmosphere elapses. Meanwhile, if there is an instruction to open the gate valve after the regulation delay time has elapsed, from that point, it may wait until the extension time for end of opening to atmosphere elapses. Accordingly, the process of opening to atmosphere in the vacuum preparation chamber in accordance with the present invention can be employed without changing other steps in the conventional sequence.

Further, let 1 Torr and 1 mTorr be 101325/760 Pa and $10^{-3} \times 101325/760$ Pa, respectively.

As described above, in accordance with the present invention, there are provided a substrate processing apparatus, a program for performing operation and control method thereof, and a computer readable storage medium for storing the program capable of effectively preventing particles from being swirled up in a chamber by suppressing a shock wave or convection caused when the gate valve is opened between chambers by means of a simple configuration.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
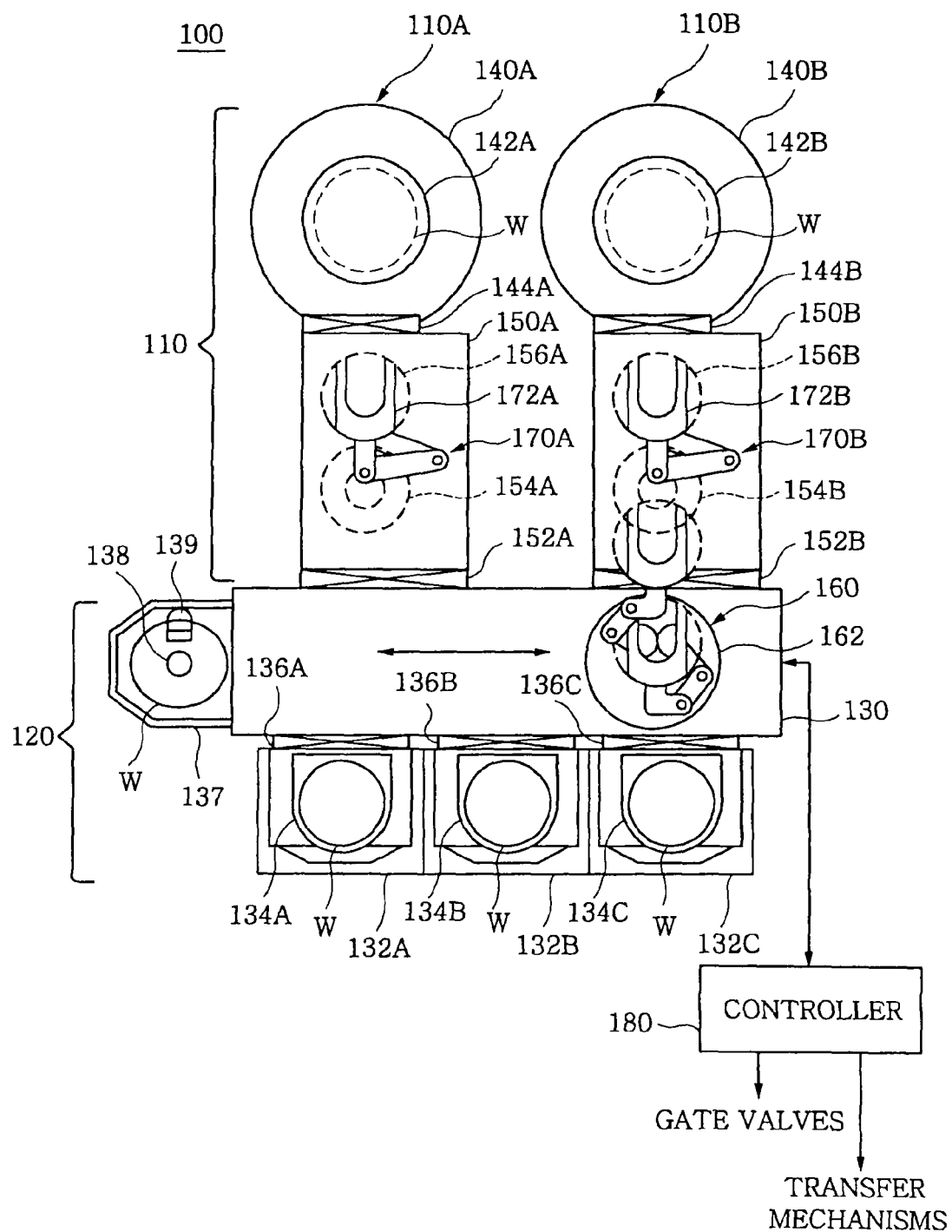
FIG. 1 schematically shows a cross sectional view of a substrate processing apparatus in accordance with an embodiment of the present invention.

Preferred embodiments of the present invention will be described in detail with reference to the accompanying drawings. Like reference numerals will be given to like parts and, further, a redundant description will be omitted.

First, there will be explained an operation and control method of a substrate processing apparatus in accordance with preferred embodiments of the present invention. One of substrate processing apparatuses for performing a process on a substrate to be processed includes a transfer chamber under the atmospheric pressure; a vacuum processing chamber for performing a process on the substrate in a vacuum state; and a vacuum preparation chamber, e.g., a load-lock chamber, disposed therebetween and connected to them. In such a substrate processing apparatus, for example, when the substrate to be processed is transferred between the transfer chamber and the load-lock chamber, a process of opening to atmosphere for approximating an inner pressure of the load-lock chamber to the atmospheric pressure in the transfer chamber is carried out to reduce a pressure difference between the chambers before the gate valve between the transfer chamber and the load-lock chamber is opened. Hereinafter, operation and control methods of the substrate processing apparatus featuring the process of opening to atmosphere are exemplified.

(Configuration Example of Substrate Processing Apparatus)

A specific example of substrate processing apparatus to which operation and control methods of the substrate processing apparatus in accordance with preferred embodiments of the present invention can be applied will be explained with reference to the drawings. Here, a substrate processing apparatus, wherein at least one vacuum processing unit is connected to a transfer chamber under the atmospheric pressure, will be exemplified. FIG. 1 schematically shows a cross sectional view of a substrate processing apparatus in accordance with the present embodiments. The substrate processing apparatus 100 includes one or more vacuum processing units 110 for performing various processes such as etching or film forming process on the substrate to be processed, for example, a semiconductor wafer W (hereinafter, simply referred to as a "wafer"); and a transfer unit 120 for loading/unloading the wafer W into/from the vacuum processing unit 110. The transfer unit 120 has a transfer chamber 130 which is commonly used when transferring the wafer W.

In FIG. 1, for example, two vacuum processing units 110A and 110B are disposed at a side of the transfer unit 120. The vacuum processing unit 110A (110B) has a processing chamber 140A (140B) and a load-lock chamber 150A (150B), connected to the processing chamber 140A (140B), that can be evacuatable. The vacuum processing units 110A and 110B perform same kinds of processes or different kinds of processes on the wafers W in the processing chambers 140A and 140B. The susceptor 142A (142B) for mounting the wafer W thereon is installed in the processing chamber 140A (140B). Further, the number of the vacuum processing units 110 including the processing chamber 140 and the load-lock chamber 150 is not limited to two and may be three or more.

The transfer chamber 130 of the transfer unit 120 is formed of a horizontally lengthened box having an approximately rectangular section, wherein a nonreactive gas such as $N_2$ gas or clean air is circulated. A plurality of cassette tables 132A, 132B and 132C are arranged at one long side of the transfer chamber 130. The cassette tables 132A, 132B and 132C serve as substrate waiting ports for mounting cassette containers 134A, 134B and 134C. Although the three cassette containers 134A, 134B and 134C are respectively mounted on the cassette tables 132A, 132B and 132C in FIG. 1, the number of cassette tables or cassette containers is not limited thereto and may be one, two, four or more.

Each of the cassette containers 134A to 134C can accommodate therein up to, for example, 25 wafers W mounted in multiple levels at an equal pitch. Further, the cassette containers 134A to 134C are sealed and filled with, for example, $N_2$ gas. Further, the wafer W can be loaded into or unloaded from the transfer chamber 130 via gate valves 136A to 136C.

A common transfer mechanism (atmospheric side transfer mechanism) 160 which transfers the wafer W in a longitudinal direction of the transfer chamber 130 (shown by an arrow in FIG. 1) is disposed in the transfer chamber 130. The common transfer mechanism 160 is fixed on, for example, a base 162 and can be slidably moved on a guide rail (not shown) installed in a central portion of the transfer chamber 130 in the longitudinal direction thereof by, e.g., a linear motor driving mechanism. The common transfer mechanism 160 may be, for example, a double-arm mechanism having two picks as shown in FIG. 1 or a single-arm mechanism having one pick.

Disposed at an end portion, i.e., one short side, of the transfer chamber 130 is an orienter (pre-alignment stage) 137 as a positioning mechanism for performing a positioning of the wafer. The orienter 137 has a rotatable table 138 and an optical sensor 139 for optically detecting a peripheral portion of the wafer W. The orienter 137 performs a position alignment by detecting a notch or an orientation flat of the wafer W.

The bases of the two load-lock chambers 150A and 150B are connected to another long side of the transfer chamber 130 via the gate valves (atmospheric side gate valves) 152A and 152B capable of being opened or closed, respectively. The processing chambers 140A and 140B are connected to the leading ends of the load-lock chambers 150A and 150B via the gate valves (vacuum side gate valves) 144A and 144B capable of being opened or closed, respectively.

A pair of buffer susceptors 154A and 156A (154B and 156B) for temporarily mounting thereon the wafer W that is waiting is disposed in the load-lock chamber 150A (150B). Here, let the buffer susceptors 154A and 154B of the transfer chamber side be first buffer susceptors; and the buffer susceptors 156A and 156B of the opposite side be second buffer susceptors. Further, an individual transfer mechanism (vacuum side transfer mechanism) 170A (170B) having a stretchable, bendable, revolvable and elevatable multi-joint arm is provided between the buffer susceptors 154A and 156A (154B and 156B). A pick 172A (172B) is disposed at the leading end of the individual transfer mechanism 170A (170B), and the wafer W can be transferred between the first and the second buffer susceptor, i.e., between the buffer susceptors 154A and 156A (154B and 156B), by using the pick 172A (172B). Further, loading/unloading of the wafer W is performed between the load-lock chamber 150A (150B) and the processing chamber 140A (140B) by using the individual transfer mechanism 170A (170B).

The substrate processing apparatus 100 is provided with a controller 180 for controlling operations of all components of the substrate processing apparatus, for example, valves of gas feed and gas evacuation pipes, to be described later, connected to the load-lock chambers 150A and 150B as well as the above-mentioned transfer mechanisms 160 and 170 and gate valves 136, 144 and 152. The controller 180 includes a microcomputer that forms a main body of the controller 180, a memory for storing, e.g., various data, and the like. Further, the controller 180 can be implemented with a general purpose computer, e.g., PC (personal computer), which has, e.g., a CPU, a mother board (MB), a hard disk (HD), memories such as ROM and RAM, a CD/DVD drive and so on. In such a case, the process control can be carried out in a completely automated manner under the control of a control program or a software running on the controller 180. Though not specifically depicted in FIG. 1, control signals are provided from the controller 180 to the components via controller lines (not shown). The control program can be directly programmed on the controller 180 or can be programmed outside to be provided thereto via, e.g., a network or the CD/DVD drive and then stored in, e.g., the hard disk for the execution thereof.

(Gas Piping Configuration of Load-Lock Chamber)

Figure 2:
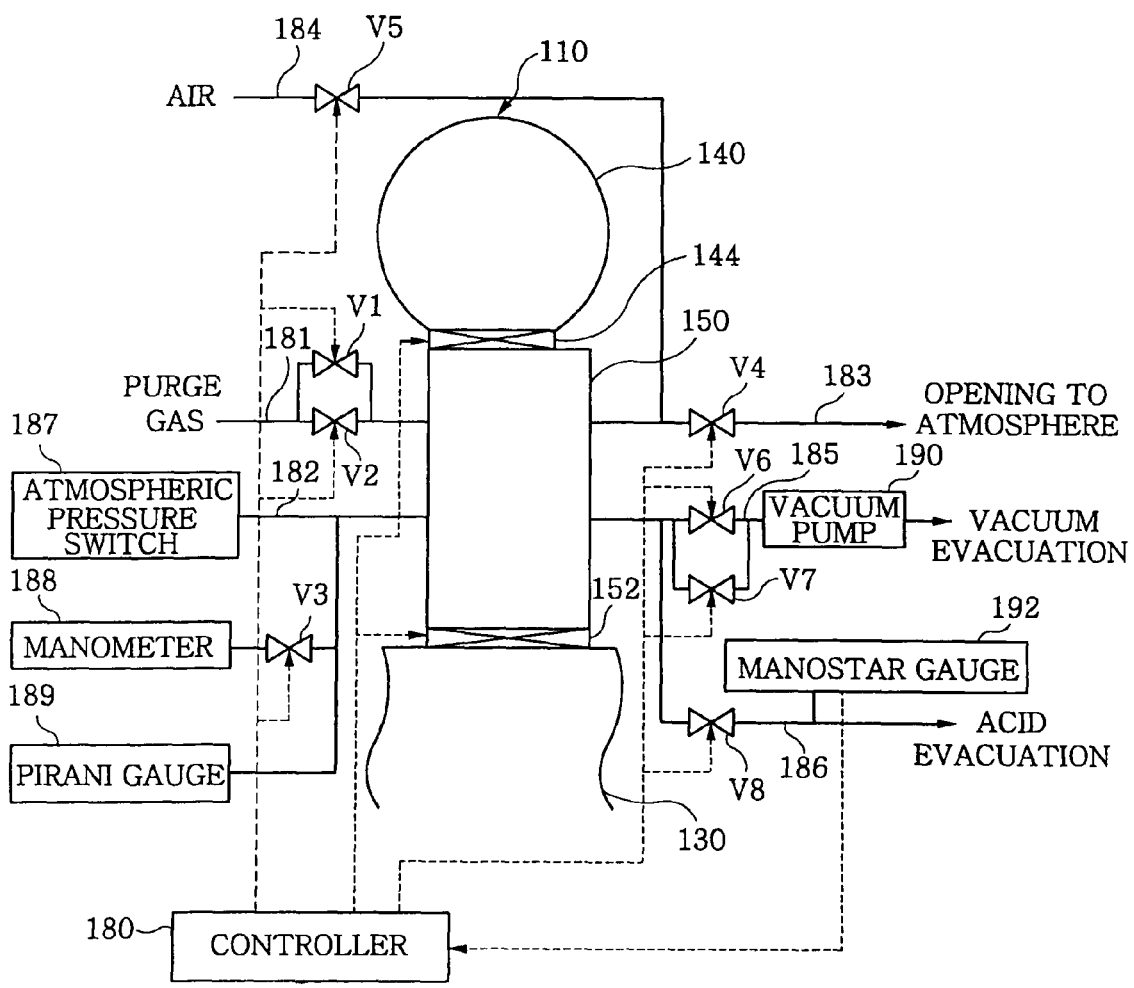
FIG. 2 shows a schematic configuration of gas piping of the load-lock chamber shown in FIG. 1.

Next, there will be described a gas piping configuration of the load-lock chamber in the vacuum processing unit with reference to drawings. FIG. 2 shows a schematic configuration of the gas piping of the load-lock chamber 150. Further, the gas piping configuration is common to both of the load-lock chambers 150A and 150B of the vacuum processing units 110A and 110B.

A nonreactive gas introducing unit is disposed at a gas feed side of the load-lock chamber 150 (for example, at an upper portion or a side portion thereof). The nonreactive gas introducing unit includes a purge gas feeding pipe 181 for supplying a nonreactive gas (e.g., Ar gas or $N_2$ gas) serving as a purge gas to the load-lock chamber 150. Control valves (purge valves) V1 and V2 arranged in parallel are inserted into the purge gas feeding pipe 181 and serve as gas introduction valves. The control valves V1 and V2 control a flow rate of the purge gas. For example, the control valve V1 is used in a process of opening to atmosphere to be discussed later, and the control valve V2 is used when controlling an inner pressure of the load-lock chamber. Further, a single control valve can be used instead of the control valves V1 and V2 for the purge gas.

Further, an atmospheric pressure state detecting unit for detecting an atmospheric pressure state is connected to the gas feed side of the load-lock chamber 150. Specifically, an atmospheric pressure switch 187 is connected to the load-lock chamber 150 via a connecting pipe 182 for the atmospheric pressure switch 187. Further, a manometer 188 is connected to the connecting pipe 182 for the atmospheric pressure switch 187 via a protection valve V3 and a Pirani vacuum gauge (Pirani gauge) 189 is also connected to the connecting pipe 182. The atmospheric pressure switch 187 includes a crystal gauge and the like. The manometer 188 is formed of, for example, a capacitance manometer (diaphragm vacuum gauge). For instance, a Conventron vacuum gauge may be employed instead of the Pirani gauge 189.

On the other hand, a unit of opening to atmosphere is disposed at an evacuation side of the load-lock chamber 150, for example, at a bottom portion of the load-lock chamber 150. The unit of opening to atmosphere includes a relief pipe (atmosphere communicating pipe) 183, which makes the load-lock chamber 150 communicate with the atmosphere via a relief valve (valve of opening to atmosphere) V4. An air feeding pipe 184 for supplying purge air is connected to the relief pipe (pipe of opening to atmosphere) 183, specifically, between the load-lock chamber 150 and the relief valve V4. A control valve V5 for controlling an air flow rate is inserted in the air feeding pipe 184.

Further, a vacuum evacuation unit is disposed at the evacuation side of the load-lock chamber 150. The vacuum evacuation unit is provided with a vacuum evacuation pipe 185 for evacuating the load-lock chamber 150 to vacuum. A main evacuation valve V6 and a slow evacuation valve V7 arranged in parallel are inserted in the vacuum evacuation pipe 185, and the vacuum evacuation pipe 185 is connected to a vacuum pump 190 such as a dry pump. The main evacuation valve V6 is used for evacuating a large amount of gas at once, and the slow evacuation valve V7 is used for a fine control of the evacuation flow rate.

Further, a corrosive gas evacuation unit is disposed at the evacuation side of the load-lock chamber 150. The corrosive gas evacuation unit includes an acid evacuation pipe 186 connected between the load-lock chamber 150 and the evacuation valves V6 and V7. In the middle of the acid evacuation pipe 186, there is installed an acid evacuation valve V8 that can be controlled for evacuating acid in the load-lock chamber 150 when a corrosive gas (e.g., $Cl_2$ and HCl) is used as a processing gas on the wafer W. Specifically, a processing gas such as the corrosive gas that can enter the load-lock chamber 150 when the wafer W is unloaded from the processing chamber 140, water that can enter it from the atmosphere and the like are evacuated via the acid evacuation valve V8. The acid evacuation pipe 186 is connected to the evacuation equipment of factory in which the vacuum processing unit is installed. The acid evacuation pipe 186 is connected to a Manostar gauge 192 which is one of the backflow detecting units.

The above-mentioned control valves V1 to V8 are controlled by, e.g., the controller 180 to thereby perform a pressure control of the load-lock chamber 150. The pressure control is performed in a process of opening to atmosphere when the gate valve 152 is opened in the load-lock chamber 150. A backflow detecting process is carried out such that the Manostar gauge 192 is monitored and when a backflow is detected, it is notified by the controller 180. The process of opening to atmosphere and backflow detecting process will be described later.

(Operations of Substrate Processing Apparatus)

Hereinafter, there will be explained operations of the substrate processing apparatus having the above-mentioned configuration with reference to the drawings. First, the wafer W to be processed is unloaded from one of the cassette containers 134A to 134C by the common transfer mechanism 160. The wafer W unloaded by the common transfer mechanism 160 is transferred to the orienter 137 and mounted on the rotatable table 138, and then a positioning of the wafer W is performed. The positioned wafer W is taken back and supported by the common transfer mechanism 160. The wafer W is transferred right in front of the load-lock chamber 150A (150B) of the vacuum processing unit 110A (110B) for performing a process on the wafer W. Then, the gate valve 152A (152B) is opened and the wafer W supported by the common transfer mechanism 160 is loaded into the load-lock chamber 150A (150B) from the transfer chamber 130. When loading of the wafer W into the load-lock chamber 150A (150B) is finished, the gate valve 152A (152B) is closed.

When the gate valve 144A (144B) is opened, the wafer W loaded into the load-lock chamber 150A (150B) is transferred into the processing chamber 140A (140B) by the individual transfer mechanism 170A (170B). When loading of the wafer W into the processing chamber 140A (140B) is finished, the gate valve 144A (144B) is closed. Processing of the wafer W is started by using, for example, a corrosive gas as a processing gas in the processing chamber 140A (140B).

Thereafter, when the processing of the wafer W is finished in the processing chamber 140A (140B), the gate valve 144A (144B) is opened and the wafer W is loaded into the load-lock chamber 150A (150B) by the individual transfer mechanism 170A (170B). When loading of the wafer W into the load-lock chamber 150A (150B) is finished, the gate valve 144A (144B) is closed and the wafer W is transferred into the transfer chamber 130. That is, when the gate valve 152A (152B) is opened, the processed wafer W loaded into the load-lock chamber 150A (150B) is transferred into the transfer chamber 130 from the load-lock chamber 150A (150B) by the common transfer mechanism 160, and the gate valve 152A (152B) is closed.

In the above-mentioned operations, when the wafer W is transferred between the load-lock chamber 150A (150B) and the transfer chamber 130 under the atmospheric pressure, a process of opening to atmosphere is performed in the load-lock chamber 150A (150B) before the gate valve 152A (152B) is opened.

(Process of Opening to Atmosphere in Load-Lock Chamber)

Hereinafter, a process of opening to atmosphere performed in the load-lock chamber 150A (150B) in accordance with the embodiment of the present invention will be explained in detail by comparing it with a conventional process with reference to the drawings. Further, the process of opening to atmosphere in accordance with the embodiment of the present invention is performed by controlling the respective valves by a controller 180 that is operated based on a specified program.

As the process of opening to atmosphere, there are first and second processes of opening to atmosphere. In the first process of opening to atmosphere, when the atmospheric pressure is formed in the load-lock chamber by introducing thereto a nonreactive gas such as $N_2$ gas serving as a purge gas, steps of opening the relief valve, closing the purge valve and opening the gate valve between the transfer chamber and the load-lock chamber are performed sequentially. In the second process of opening to atmosphere, wherein a throughput of the substrate processing apparatus is taken more seriously, the gate valve is made to be opened after the relief valve is opened, and the purge valve is closed when the gate valve is opened. The process of opening to atmosphere in accordance with the present invention can be applied to both the first and the second process of opening to atmosphere, and respective cases will be described separately.

(First Process of Opening to Atmosphere)

Figure 3:
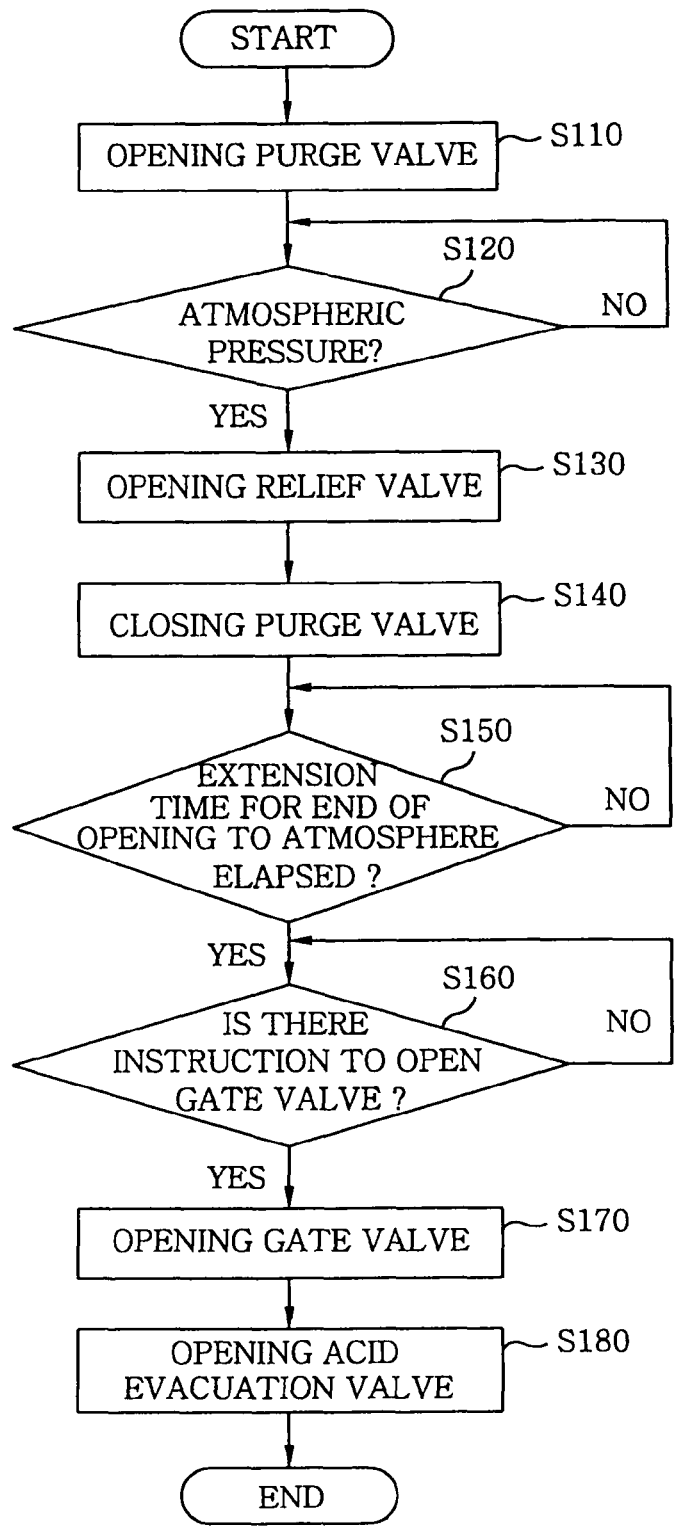
FIG. 3 is a flowchart showing a conventional example of a first process of opening to atmosphere.
Figure 4:
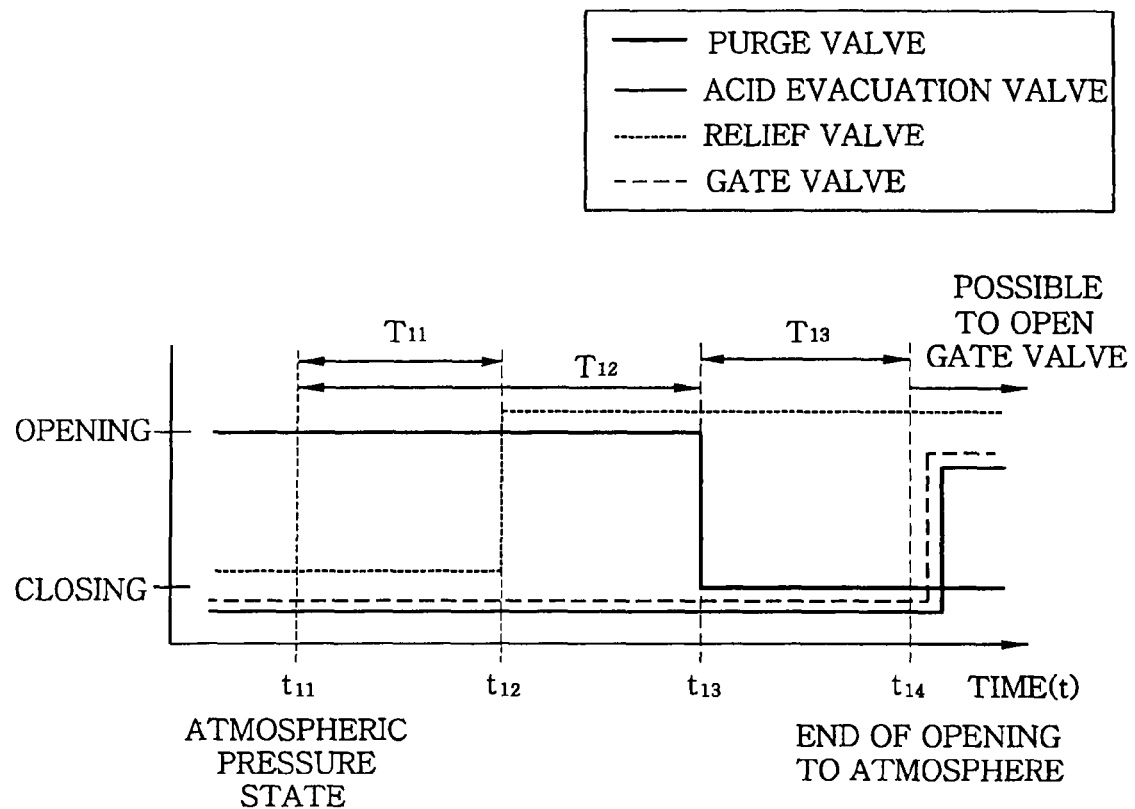
FIG. 4 depicts a broken-line graph showing timings when each valve is opened or closed in the process shown in FIG. 3.

First, a conventional example of the first process of opening to atmosphere will be explained for comparing with that of the present invention. FIG. 3 is a flowchart showing the conventional example of the first process of opening to atmosphere, and FIG. 4 depicts control states of respective valves in the process shown in FIG. 3. FIG. 4 is a broken-line graph showing timings when each valve is opened or closed. Further, when broken lines overlap with each other, they are drawn as slightly separated lines for distinction.

As shown in FIGS. 3 and 4, in the conventional example of the first process of opening to atmosphere, first, at step S110, the control valve (purge valve) V1 shown in FIG. 2 is opened and a nonreactive gas such as $N_2$ gas serving as a purge gas is introduced into the load-lock chamber 150. Then, at step S120, it is determined whether or not the load-lock chamber 150 is under the atmospheric pressure, for example, as follows. If the atmospheric pressure switch 187 shown in FIG. 2 is turned on and, at the same time, the Pirani gauge 189 indicates the atmospheric pressure (760 Torr), it is determined that the pressure of the load-lock chamber 150 becomes same as the atmospheric pressure.

At step S120, if it is determined that the pressure of the load-lock chamber 150 becomes same as the atmospheric pressure at a time point $t_{11}$, the process proceeds to step S130. At step S130, when a specified time period $T_{11}$ has elapsed from the time point $t_{11}$ as shown in FIG. 4, the relief valve V4 is opened to make the load-lock chamber 150 communicate with the atmosphere.

Then, at step S140, when a specified time period $T_{12}$ has elapsed from the time point $t_{11}$, the control valve (purge valve) V1 is closed at a time point $t_{13}$ to stop introducing the purge gas. Subsequently, at step S150, it waits till an extension time for end of opening to atmosphere $T_{13}$ elapses from the time point $t_{13}$. When the extension time for end of opening to atmosphere $T_{13}$ has elapsed, the process of opening to atmosphere is finished and, from that point, it is possible to open the gate valve 152.

At step S150, if it is determined that the extension time for end of opening to atmosphere $T_{13}$ has elapsed, the process proceeds to step S160 to wait for an instruction to open the gate valve 152. Then, at step S160, if it is determined that there is the instruction to open the gate valve 152, the process proceeds to step S170 where the instruction to open the gate valve 152 is accepted to open the gate valve 152. When the gate valve 152 is opened, the process proceeds to step S180 where the acid evacuation valve V8 is opened to thereby start the evacuation performance and the whole process of opening to atmosphere is finished. For example, this process is for evacuating a processing gas such as corrosive gas (e.g., $Cl_2$ and HCl), which enters the load-lock chamber 150 when the wafer W is unloaded from the processing chamber 140. Practically, the pressure in the load-lock chamber 150 is made higher than that in the processing chamber 140 when the wafer W is transferred from the processing chamber 140 such that a small convection occurs from the load-lock chamber 150 to the processing chamber 140 in order to prevent the corrosive gas from entering the load-lock chamber 150 from the processing chamber 140. However, the corrosive gas can enter the load-lock chamber 150 by being attached to the wafer W.

As described above, in the conventional first process of opening to atmosphere, after the load-lock chamber 150 becomes open to the atmosphere, the pressure of the load-lock chamber 150 is also made higher than that of the transfer chamber 130 by introducing the purge gas into the load-lock chamber 150 to thereby prevent an outside air from entering it. Accordingly, since contaminants such as water included in the outside air can be prevented from entering the load-lock chamber 150, it is possible to prevent cross contamination to the wafer W.

However, recently, for example, due to the sealing improvement of a maintenance door in the load-lock chamber 150, airtightness of the load-lock chamber 150 is further enhanced. Nevertheless, conventionally, since the time period $T_{12}$ set to be elapsed until the introduction of the purge gas is stopped is fixed as a constant as shown in FIG. 4, the pressure of the load-lock chamber 150 tends to become needlessly higher than that of the transfer chamber 130 due to the introduction of the purge gas. Consequently, when the gate valve 152 between the load-lock chamber 150 and the transfer chamber 130 is opened, a shock wave or rapid convection could be generated. If a shock wave or rapid convection occurs, it leads to a problem such that particles tend to be swirled up therealong in the load-lock chamber 150.

Further, in the conventional first process of opening to atmosphere, since the acid evacuation valve V8 is closed until the gate valve 152 is opened, the load-lock chamber 150 communicates with the atmosphere by opening the relief valve V4. Accordingly, for example, in case when the relief pipe 183 communicates with the transfer chamber 130, the corrosive gas remaining in the load-lock chamber 150 can flow into the transfer chamber 130. The corrosive gas which flows into the transfer chamber 130 causes parts of mechanisms in the transfer chamber 130 to be corroded.

Therefore, in the process of opening to atmosphere in accordance with the present invention, timings of closing the control valve (purge valve) V1 and opening the acid evacuation valve V8 can be freely set. Accordingly, for example, at a time point when the pressure of the load-lock chamber 150 becomes same as the atmospheric pressure, simultaneously, the control valve (purge valve) V1 is closed to stop introducing the purge gas, and the acid evacuation valve V8 is opened. As a result, it is prevented that the pressure of the load-lock chamber 150 becomes needlessly increased and, further, the corrosive gas remaining in the load-lock chamber 150 can be evacuated in advance before the gate valve 152 is opened.

(First Process of Opening to Atmosphere in Accordance with the Present Invention)

Figure 5:
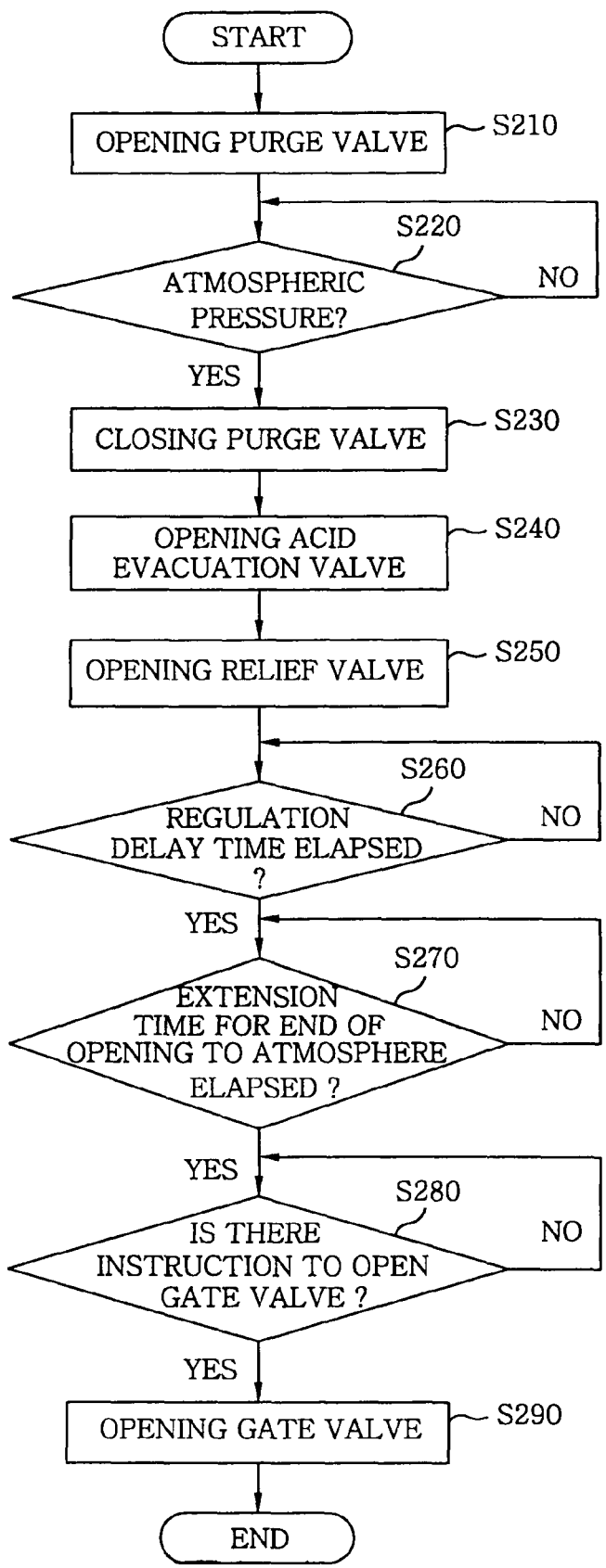
FIG. 5 is a flowchart showing a first process of opening to atmosphere in accordance with the present invention, which is performed by a controller.
Figure 6:
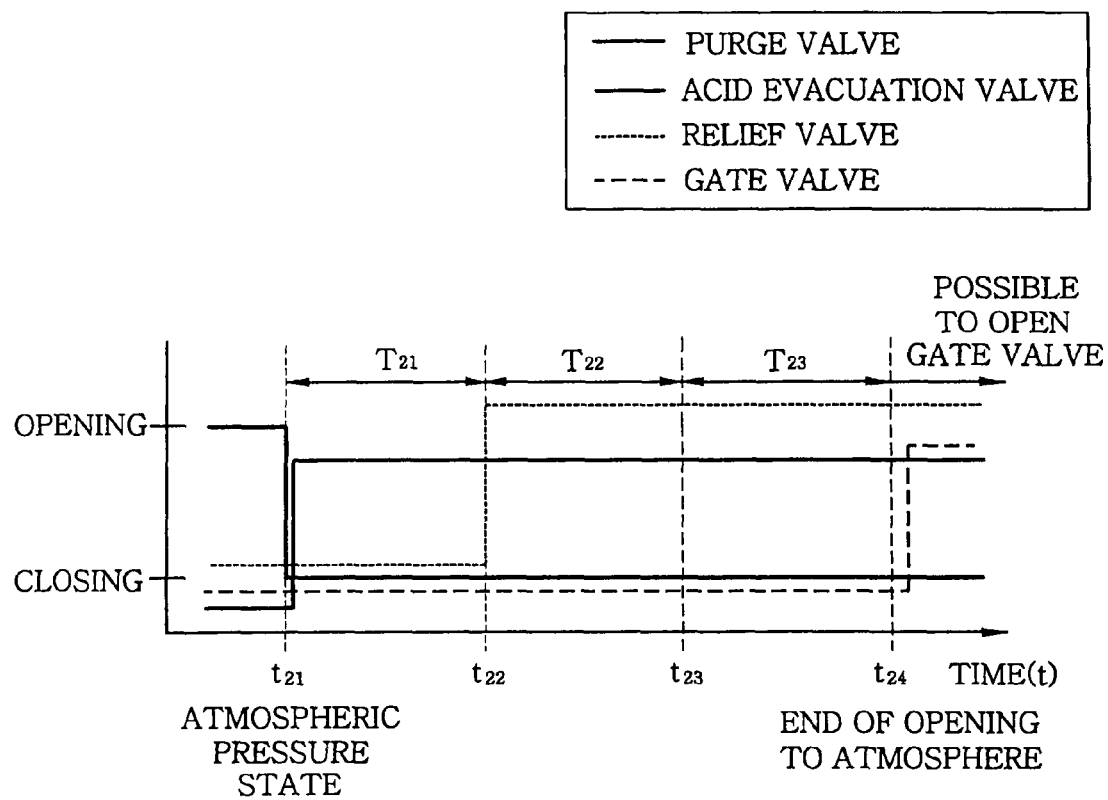
FIG. 6 depicts a broken-line graph showing timings when each valve is opened or closed in the process shown in FIG. 5.

Hereinafter, an example of a first process of opening to atmosphere in accordance with the present invention will be explained with reference to FIGS. 5 and 6. In this example, at a time point when the pressure of the load-lock chamber 150 becomes same as the atmospheric pressure, the control valve (purge valve) V1 is closed to stop introducing the purge gas and the acid evacuation valve V8 is opened. FIG. 5 is a flowchart showing a first process of opening to atmosphere in accordance with the present invention, which is performed by a controller. FIG. 6 depicts control states of respective valves in the process shown in FIG. 5. FIG. 6 is, similarly to FIG. 4, a broken-line graph showing timings when each valve is opened or closed. Further, when broken lines overlap each other, they are drawn as slightly separated lines for distinction.

The process of opening to atmosphere in accordance with the present invention is performed based on a program by the controller 180 as follows. That is, as shown in FIGS. 5 and 6, first, at step S210, the control valve (purge valve) V1 shown in FIG. 2 is opened and a nonreactive gas such as $N_2$ gas serving as a purge gas is introduced into the load-lock chamber 150. Then, at step S220, it is determined whether or not the load-lock chamber 150 is under the atmospheric pressure, for example, in the same way as in step S120 shown in FIG. 3. Namely, if the atmospheric pressure switch 187 shown in FIG. 2 is turned on and, at the same time, the Pirani gauge 189 indicates the atmospheric pressure (760 Torr), it is determined that the pressure of the load-lock chamber 150 becomes same as the atmospheric pressure.

At step S220, if it is determined that the pressure of the load-lock chamber 150 becomes same as the atmospheric pressure at a time point $t_{21}$, for example, simultaneously, the process proceeds to step S230. At step S230, as shown in FIG. 6, the control valve (purge valve) V1 is closed to stop the introduction of the purge gas. At the same time, at step S240, the acid evacuation valve V8 is opened to start at an early stage evacuating the corrosive gas that enters the load-lock chamber 150.

Then, the process proceeds to step S250, wherein when a specified time period $T_{21}$ elapses from the time point $t_{21}$, as shown in FIG. 6, the relief valve V4 is opened such that the load-lock chamber 150 communicates with the atmosphere.

Subsequently, at step S260, it waits until a regulation delay time $T_{22}$ elapses from the time point $t_{22}$ such that the gate valve 152 can be opened at the same time as the gate valve is opened in the conventional sequence. Accordingly, a time period (shown in FIG. 6) from the time point $t_{21}$ when the load-lock chamber 150 becomes open to the atmosphere to the time point when the gate valve is opened can be made same as a time period (shown in FIG. 4) from the time point $t_{11}$ when the load-lock chamber 150 becomes open to the atmosphere to the time point when the gate valve is opened. Thus, the process of opening to atmosphere in accordance with the present invention can be employed without changing other steps in the conventional sequence. Further, the step where it waits until the regulation delay time elapses is not necessarily required. By omitting the step, the gate valve 152 can be opened earlier than before. Accordingly, the total time for the sequence can be shortened.

At step S260, if it is determined that the regulation delay time $T_{22}$ has elapsed, the process proceeds to step S270 where it waits until an extension time for end of opening to atmosphere $T_{23}$ elapses. When the extension time for end of opening to atmosphere $T_{23}$ elapses, opening to atmosphere is finished and it is possible to open the gate valve 152 between the transfer chamber 130 and the load-lock chamber 150.

At step S270, when it is determined that the extension time for end of opening to atmosphere $T_{23}$ has elapsed, the process proceeds to step S280 to wait for an instruction to open the gate valve 152. Then, at step S280, when it is determined that there is the instruction to open the gate valve 152, the process proceeds to step S290 where the instruction to open the gate valve 152 is accepted to open the gate valve 152. Thus, the whole process of opening to atmosphere is finished.

As described above, in the first process of opening to atmosphere in accordance with the present invention, the control valve (purge valve) V1 is closed right after the pressure of the load-lock chamber 150 becomes same as the atmospheric pressure. By such a simple change in the sequence, it is prevented that the pressure of the load-lock chamber 150 becomes needlessly increased. Consequently, it is prevented that a shock wave or rapid convection occurs when the gate valve 152 is opened, thereby preventing particles from being swirled up in the load-lock chamber 150.

Further, the acid evacuation valve V8 is opened early before the gate valve 152 is opened, whereby the corrosive gas remaining in the load-lock chamber 150 can be evacuated in advance. Accordingly, although the relief valve V4 is opened after that, the corrosive gas can be prevented from flowing into, e.g., the transfer chamber 130 via the relief valve V4. Resultantly, it can be prevented that parts of mechanisms in the transfer chamber 130 are corroded.

(Second Process of Opening to Atmosphere)

Figure 7:
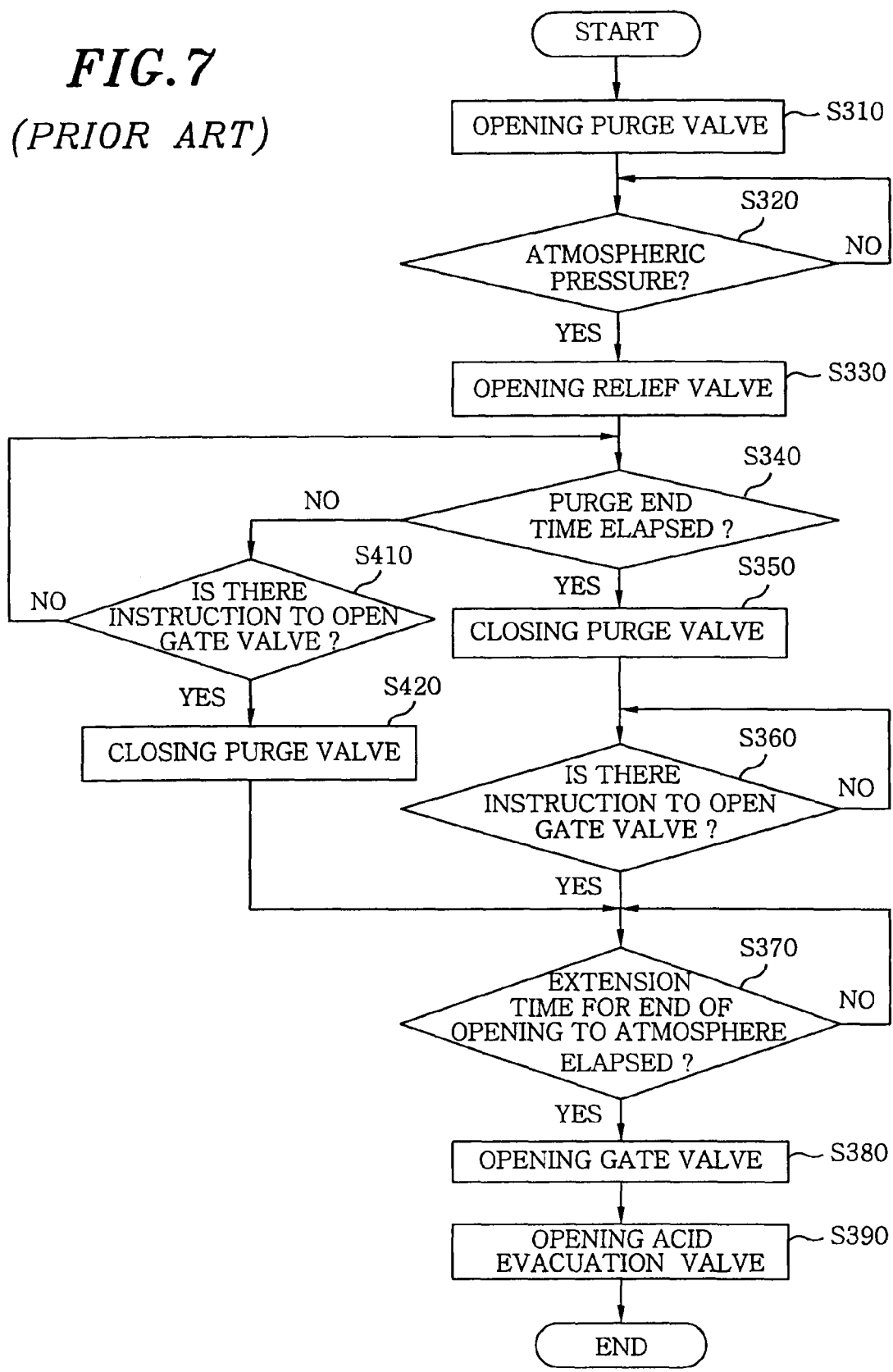
FIG. 7 is a flowchart showing a conventional example of a second process of opening to atmosphere.
Figure 8:
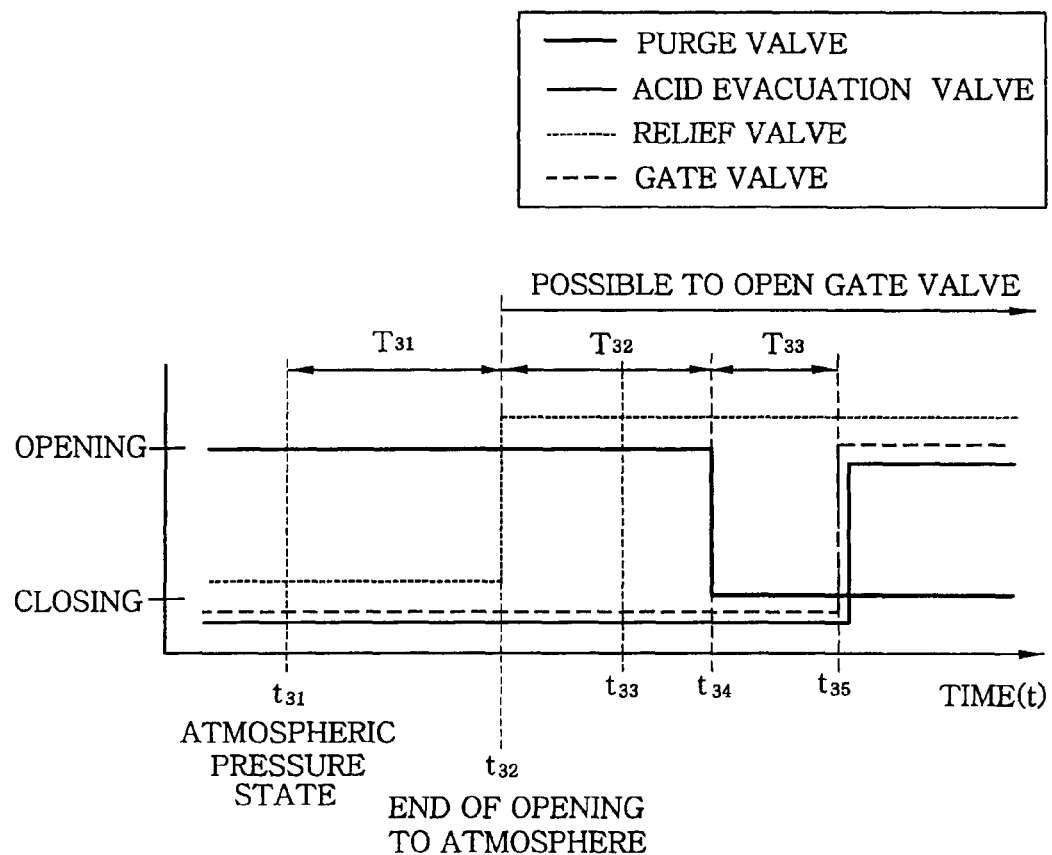
FIG. 8 depicts a broken-line graph showing timings when each valve is opened or closed in the process shown in FIG. 7.

Next, a conventional example of a second process of opening to atmosphere will be explained for comparing it with the present invention. FIG. 7 is a flowchart showing the conventional example of the second process of opening to atmosphere, and FIG. 8 depicts control states of respective valves in the process shown in FIG. 7. FIG. 8 is, similarly to FIG. 4, a broken-line graph showing timings when each valve is opened or closed. Further, when broken lines overlap each other, they are drawn as slightly separated lines for distinction.

As shown in FIGS. 7 and 8, in the conventional example of the second process of opening to atmosphere, first, at step S310, the control valve (purge valve) V1 shown in FIG. 2 is opened and a nonreactive gas such as $N_2$ gas serving as a purge gas is introduced into the load-lock chamber 150. Subsequently, as step S320, it is determined whether or not the load-lock chamber 150 is under the atmospheric pressure in the same way as in step S120 shown in FIG. 3. At step S320, if it is determined that the pressure of the load-lock chamber 150 becomes same as the atmospheric pressure at a time point $t_{31}$, the process proceeds to step S330. At step S330, when a specified time period $T_{31}$ elapses from the time point $t_{31}$, the relief valve V4 is opened to let the load-lock chamber 150 communicate with the atmosphere. In the second process of opening to atmosphere, at a time point $t_{32}$ when the relief valve V4 is opened, the opening to atmosphere is finished and from that point, it is possible to accept an instruction to open the gate valve 152. Thereafter, regardless of the instruction to open the gate valve 152, when a specified time period $T_{32}$ elapses, the control valve (purge valve) V1 is closed to stop introducing the purge gas.

Then, at step S340, it is determined whether or not a purge end time $T_{32}$ has elapsed from the time point $t_{32}$. If it is determined that the purge end time $T_{32}$ has not elapsed at step S340, the process proceeds to step S410 where it is determined whether or not there is an instruction to open the gate valve 152.

At step S410, if it is determined that there is no instruction to open the gate valve 152, the process returns to step S340. While there is no instruction to open the gate valve 152, at step S340, if it is determined that the purge end time $T_{32}$ has elapsed, the process proceeds to step S350 where the control valve (purge valve) V1 is closed to stop introducing the purge gas.

Then, at step S360, if it is determined that there is an instruction to open the gate valve 152, the instruction is accepted and the process proceeds to step S370 where it waits until an extension time for end of opening to atmosphere $T_{33}$ elapses. At step S370, if it is determined that the extension time for end of opening to atmosphere $T_{33}$ has elapsed, the process proceeds to step S380 where the gate valve 152 is opened. When the gate valve 152 is opened, the process proceeds to step S390 where the acid evacuation valve V8 is opened, whereby the evacuation performance of, e.g., corrosive gas is carried out and the whole process of opening to atmosphere is finished.

In contrast, in a state where the purge end time $T_{32}$ has not elapsed, if it is determined that there is an instruction to open the gate valve 152 at step S410, the instruction is accepted and the process proceeds to step S420 where the control valve (purge valve) V1 is closed to stop introducing the purge gas. Then, the process proceeds to step S370. If it is determined that an extension time for end of opening to atmosphere $T_{33}$ has elapsed at step S370, the process proceeds to step S380 where the gate valve is opened. Then, at step S390, the acid evacuation valve V8 is opened, whereby the evacuation process of, e.g., corrosive gas is performed and the whole process of opening to atmosphere is finished.

As described above, in the conventional second process of opening to atmosphere, if there is no instruction to open the gate valve 152 during the purge end time $T_{32}$, the control valve (purge valve) V1 is closed to stop introducing the purge gas when the purge end time $T_{32}$ elapses. On the contrary, if there arrives an instruction to open the gate valve 152 during the purge end time $T_{32}$, at that time, the control valve (purge valve) V1 is closed to stop introducing the purge gas. Accordingly, the gate valve 152 can be opened earlier than the first process of opening to atmosphere.

Also in the conventional second process of opening to atmosphere, in the same manner as in the first process of opening to atmosphere, after the load-lock chamber 150 becomes open to the atmosphere, the pressure of the load-lock chamber 150 is made higher than that of the transfer chamber 130 by introducing the purge gas into the load-lock chamber 150 to thereby prevent an outside air from entering it. Accordingly, since contaminants such as water included in the outside air can be prevented from entering the load-lock chamber 150, it is possible to prevent cross contamination to the wafer W.

In the conventional second process of opening to atmosphere, a timing of closing the control valve (purge valve) V1 may become earlier than that of the conventional first process of opening to atmosphere. However, the instruction to open the gate valve 152 cannot be accepted unless at least the specified time period $T_{31}$ from the time point $t_{31}$ has elapsed and the relief valve V4 is opened thereafter. Thus, the pressure of the load-lock chamber 150 tends to become needlessly higher than that of the transfer chamber 130 until the introduction of the purge gas is stopped. Consequently, when the gate valve 152 is opened, a shock wave or rapid convection can be generated, whereby it leads to the same problem as that in the conventional first process of opening to atmosphere, namely, having particles to swirl up therealong in the load-lock chamber 150.

Further, in the conventional second process of opening to atmosphere, since the acid evacuation valve V8 is closed until the gate valve 152 is opened, the load-lock chamber 150 communicates with the atmosphere by opening the relief valve V4. Accordingly, for example, in case that the relief pipe 183 communicates with the transfer chamber 130, the corrosive gas remaining in the load-lock chamber 150 can flow into the transfer chamber 130. As a result, there also occurs the same problem as that in the conventional first process of opening to atmosphere, namely, that parts of mechanisms in the transfer chamber 130 may be corroded.

Therefore, in the second process of opening to atmosphere of the present invention, similarly, timings of closing the control valve (purge valve) V1 and opening the acid evacuation valve V8 can be freely set. Accordingly, for example, at a time point when the pressure of the load-lock chamber 150 becomes same as the atmospheric pressure, the control valve (purge valve) V1 is closed to stop introducing the purge gas and the acid evacuation valve V8 is opened. Resultantly, it is prevented that the pressure of the load-lock chamber 150 becomes needlessly increased and, further, the corrosive gas remaining in the load-lock chamber 150 can be evacuated in advance before the gate valve 152 is opened.

(Second Process of Opening to Atmosphere in Accordance with the Present Invention)

Figure 9:
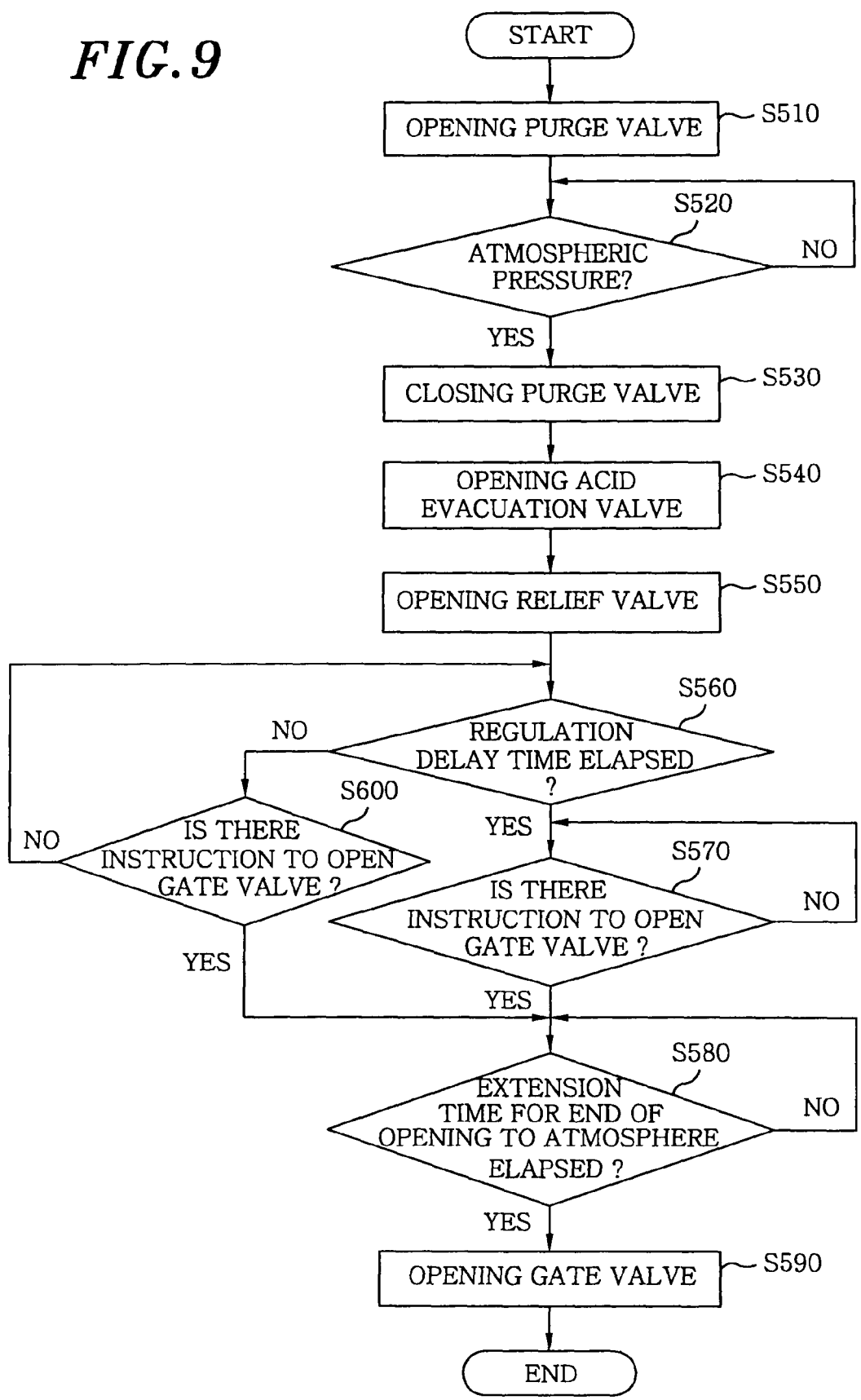
FIG. 9 is a flowchart showing a second process of opening to atmosphere in accordance with the present invention, which is performed by a controller.
Figure 10:
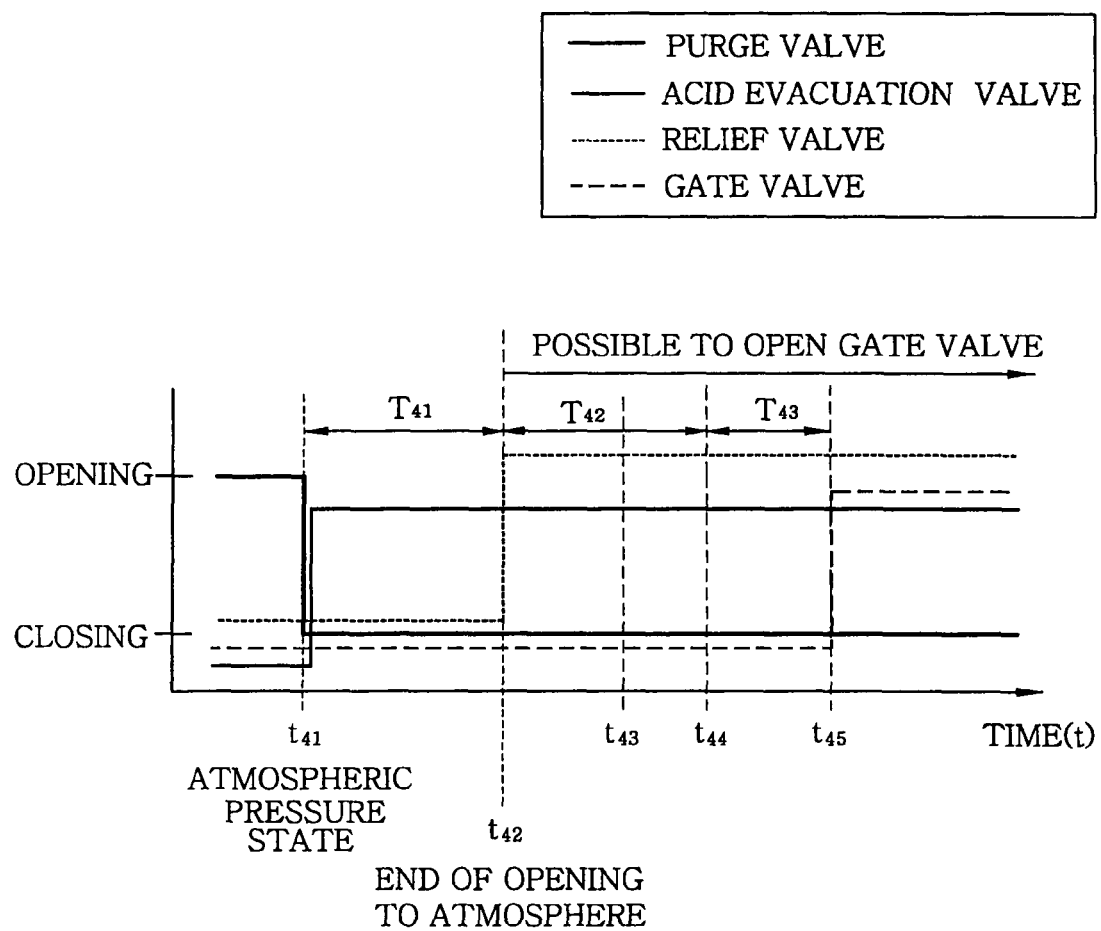
FIG. 10 depicts a broken-line graph showing timings when each valve is opened or closed in the process shown in FIG. 9.

Hereinafter, an example of the second process of opening to atmosphere in accordance with the present invention will be explained with reference to FIGS. 9 and 10. In this example, at a time point when the pressure of the load-lock chamber 150 becomes same as the atmospheric pressure, the control valve (purge valve) V1 is closed to stop introducing the purge gas to the load-lock chamber 150 and the acid evacuation valve V8 is opened. FIG. 9 is a flowchart showing the example of the second process of opening to atmosphere in accordance with the present invention, which is performed by a controller. FIG. 10 depicts control states of respective valves in the process shown in FIG. 9. FIG. 10 is, similarly to FIG. 4, a broken-line graph showing timings when each valve is opened or closed. Further, when broken lines overlap with each other, they are drawn as slightly separated lines for distinction.

The process of opening to atmosphere in accordance with the present invention is performed based on a program by the controller 180 as follows. That is, as shown in FIGS. 9 and 10, first, at step S510, the control valve (purge valve) V1 shown in FIG. 2 is opened and a nonreactive gas such as $N_2$ gas serving as a purge gas is introduced into the load-lock chamber 150. Then, at step S520, it is determined whether or not the load-lock chamber 150 is under the atmospheric pressure, for example, in the same way as in step S120 shown in FIG. 3.

At step S520, if it is determined that the pressure of the load-lock chamber 150 becomes same as the atmospheric pressure at a time point $t_{41}$, for example, simultaneously, the process proceeds to step S530. At step S530, as shown in FIG. 10, the control valve (purge valve) V1 is closed to stop the introduction of the purge gas. At the same time, at step S540, the acid evacuation valve V8 is opened to start, at an early stage, evacuating the corrosive gas that enters the load-lock chamber 150.

Then, the process proceeds to step S550, wherein when a specified time period $T_{41}$ elapses from the time point $t_{41}$, as shown in FIG. 10, the relief valve V4 is opened such that the load-lock chamber 150 starts to communicate with the atmosphere.

Subsequently, at step S560, it is determined whether or not a regulation delay time $T_{42}$ has elapsed from the time point $t_{42}$. The regulation delay time is introduced to make the gate valve 152 be opened at the same time as the gate valve is opened in the conventional sequence shown in FIGS. 7 and 8. Accordingly, a time period from the time point $t_{41}$, shown in FIG. 10, when the load-lock chamber 150 becomes open to the atmosphere to the time point when the gate valve is opened can be made equal to the time period from the time point $t_{31}$, shown in FIG. 8, when the load-lock chamber 150 becomes open to the atmosphere to the time point when the gate valve is opened. Thus, the process of opening to atmosphere in accordance with the present invention can be applied without changing other steps in the conventional sequence. Further, the step where it waits until a regulation delay time elapses is not necessarily required. By omitting the step, the gate valve 152 can be opened earlier than ever. Accordingly, the total time for the sequence can be shortened.

At step S560, if it is determined that the regulation delay time $T_{42}$ has not elapsed, the process proceeds to step S600 where it is determined whether or not there is the instruction to open the gate valve 152. At step S600, when it is determined that there is no instruction to open the gate valve 152, the process returns to step S560. While there is no instruction to open the gate valve 152, at step S560, when it is determined that the regulation delay time $T_{42}$ has elapsed, the process proceeds to step S570 where it is determined whether or not there is an instruction to open the gate valve 152.

Then, at step S570, if it is determined that there is an instruction to open the gate valve 152, the instruction is accepted and the process proceeds to step S580 where it waits until an extension time for end of opening to atmosphere $T_{43}$ elapses. At step S580, if it is determined that the extension time for end of opening to atmosphere $T_{43}$ has elapsed, the process proceeds to step S590 where the gate valve 152 is opened, and the whole process of opening to atmosphere is finished.

In contrast, in a state where the regulation delay time $T_{42}$ has not elapsed, when it is determined that there is an instruction to open the gate valve 152 at step S600, the instruction is accepted and the process proceeds to step S580. When it is determined that an extension time for end of opening to atmosphere $T_{43}$ has elapsed at step S580, the process proceeds to step S590 where the gate valve 152 is opened, and the whole process of opening to atmosphere is finished.

As described above, in the second process of opening to atmosphere in accordance with the present invention, the control valve (purge valve) V1 is closed right after the pressure of the load-lock chamber 150 becomes same as the atmospheric pressure. By such a simple change in the sequence, it can be prevented that the pressure of the load-lock chamber 150 becomes needlessly increased. Consequently, a shock wave or rapid convection is prevented from occurring when the gate valve 152 is opened, thereby preventing particles from being swirled up in the load-lock chamber 150.

Further, the acid evacuation valve V8 is opened in advance without waiting for opening the gate valve 152, whereby the corrosive gas remaining in the load-lock chamber 150 can be evacuated in advance. Accordingly, although the relief valve V4 is opened after that, the corrosive gas can be prevented from flowing into the transfer chamber 130 via the relief valve V4. Resultantly, it can be prevented that parts of mechanisms in the transfer chamber 130 are corroded.

Moreover, in the processes of opening to atmosphere in accordance with the present invention, as shown in FIGS. 5 and 9, at a time point when the pressure of the load-lock chamber 150 becomes same as the atmospheric pressure, simultaneously, the control valve (purge valve) V1 is closed to stop introducing the purge gas into the load-lock chamber 150 and the acid evacuation valve V8 is opened. But, the present invention is not limited thereto. In the present invention, timings of closing the control valve (purge valve) V1 and opening the acid evacuation valve V8 can be freely set. Depending on setting of the timings, the control valve (purge valve) V1 is closed and, somewhat later, the acid evacuation valve V8 is opened. Further, the pressure of the load-lock chamber 150 becomes same as the atmospheric pressure and, somewhat later, it is also possible to close the control valve (purge valve) V1 and open the acid evacuation valve V8. In order to prevent particles from being swirled up in the load-lock chamber 150 when the gate valve 152 is opened, it is desirable that those timings are set such that the inner pressure of the load-lock chamber 150 does not become excessively higher than the atmospheric pressure by an introduction of the purge gas or an evacuation.

(Backflow Detecting Process when Acid Evacuation Valve is Opened)

Hereinafter, in the process of opening to atmosphere in accordance with the present invention, there will be described a backflow detecting process performed when the acid evacuation valve is opened with reference to the drawings. In the present invention, as shown in FIGS. 5 and 9, at a time point when the pressure of the load-lock chamber 150 becomes same as the atmospheric pressure, that is, at an early state where the relief valve V4 or the gate valve 152 is not opened yet, the control valve (purge valve) V1 is closed and the acid evacuation valve V8 is opened. Accordingly, a backflow can occur momentarily in the acid evacuation valve 186, but such a backflow will be controlled after a specified time period passes.

However, when a backflow detecting unit, e.g., the Manostar gauge 192, detects a backflow in the acid evacuation pipe 186, it is notified by, e.g., a buzzer. Further, depending on an error process performed when a backflow occurs, the acid evacuation valve V8 may be forced to be closed.

Figure 11:
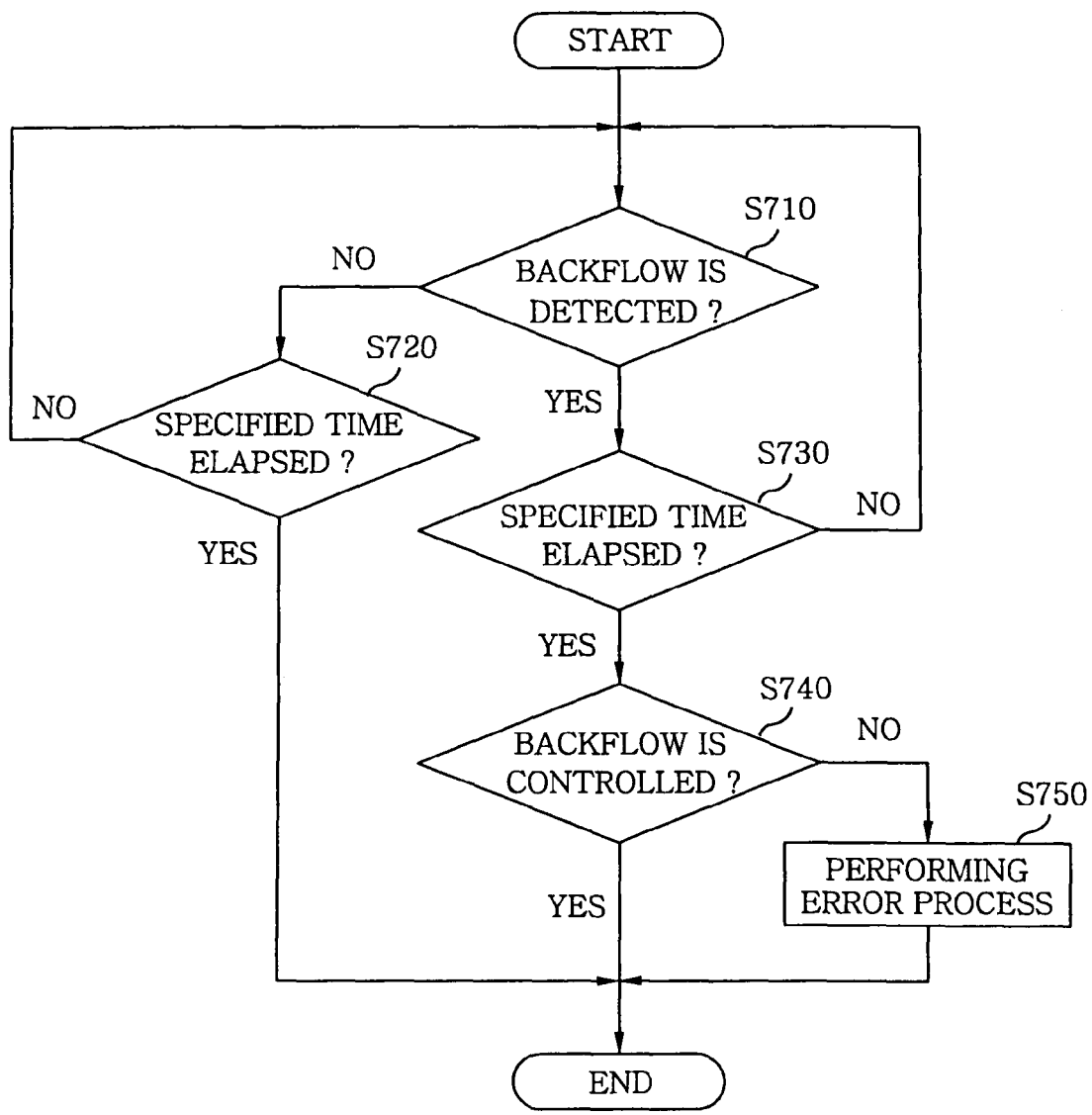
FIG. 11 is a flowchart showing a backflow detecting process conducted when an acid evacuation valve shown in FIG. 2 is opened.

Thus, in the present invention, when the acid evacuation valve V8 is opened, a backflow detecting process shown in FIG. 11 is conducted, wherein although a backflow can occur momentarily in the acid evacuation valve 186, an error process is not performed if the backflow becomes controlled within a specified time period.

In the backflow detecting process shown in FIG. 11, when the acid evacuation valve V8 is opened, at step S710, it is determined whether or not a backflow is detected in the acid evacuation pipe 186 by the backflow detecting unit, e.g., the Manostar gauge 192. If it is determined that a backflow is not detected at step S710, the process proceeds to step S720 where it is determined whether or not a specified time period, for example, 3 seconds, has elapsed. If the specified time period has not elapsed, the process returns to step S710. If the backflow is not detected within the specified time period and, further, it is determined that the specified time period has elapsed at step S720, the backflow detecting process is finished. The specified time period is, preferably, a time period during which the backflow will become controlled even though the backflow occurs momentarily, wherein the time period may be obtained based on the experimental results. But, since there is a difference depending on the substrate processing apparatus, preferably, the specified time period of detecting the backflow may be freely set. Specifically, the specified time period can be set between 0 to 10 seconds.

In contrast, if it is determined that a backflow is detected at step S710, the process proceeds to step S730 where it is determined whether or not the specified time period has elapsed. If it is determined that the specified time period has not elapsed at step S730, the process returns to step S710 where the backflow is kept being detected until the specified time period passes. Then, when it is determined that the specified time period has elapsed at step S730, the process proceeds to step S740 where it is determined whether or not the backflow is under control. For example, in case that the backflow is not detected after the specified time period passes, it is determined that the backflow is under control. On the contrary, in case that the backflow is still detected after the specified time period has elapsed, it is determined that the backflow is not under control.

If it is determined that the backflow is under control at step S740, the backflow detecting process is finished, whereas if it is determined that the backflow is not under control at step S740, the process proceeds to step S750 where the error process is performed. As the error process, notification is done by, e.g., a buzzer and, also, the acid evacuation valve V8 is forced to be closed.

In such a backflow detecting process, although the backflow is detected momentarily in the acid evacuation pipe 186, the error process is not conducted if the backflow becomes controlled within the specified time period. Accordingly, when the acid evacuation valve V8 is opened early before the gate valve 152 is opened in the present invention, it is possible to avoid a practical problem such as the one that the acid evacuation valve V8 is closed just simply because a momentary backflow has occurred in the acid evacuation pipe 186.

(Verification on Swirling Up of Particles)

As described above, in case that the process of opening to atmosphere performed in the load-lock chamber in accordance with the present invention is applied to the substrate processing apparatus shown in FIG. 1, the timings of opening/closing the purge valve or the acid evacuation valve can be controlled such that particles can be prevented from being swirled up due to a pressure difference between the load-lock chamber and the transfer chamber when the gate valve is opened.

The swirling up of particles is caused by a shock wave or rapid convection occurring when the gate valve is opened between chambers having a pressure difference, for example, between the transfer chamber and the load-lock chamber or between the processing chamber and the load-lock chamber. For example, the shock wave propagates instantly in the chamber, thereby causing a rapid flow. Accordingly, the particles are detached from walls of the chamber and swirled up in the chamber.

The shock wave occurs under a certain condition such as a condition on a magnitude of a pressure difference between chambers. Thus, swirling up of the particles can be generated by the shock wave depending on the pressure difference.

Hereinafter, there will be explained results of an experiment on how the pressure difference between the chambers affects the swirling up of particles with reference to drawings. Here, various pressure differences are formed between the processing chamber 140 and the load-lock chamber 150 shown in FIG. 1, and an amount of particles swirling up in the processing chamber 140 when the gate valve 144 is opened is detected.

Figure 12A:
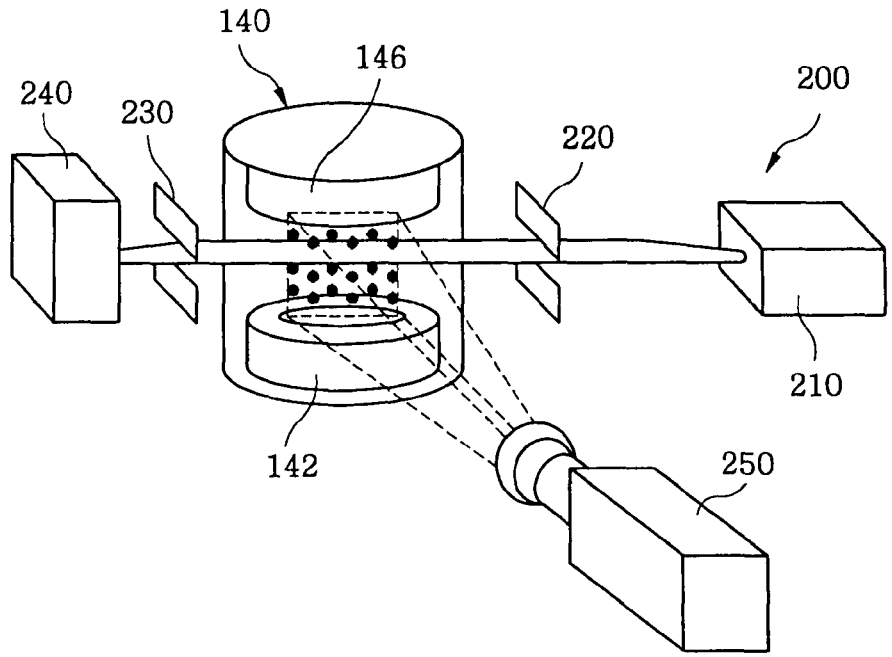
FIGS. 12A and 12B show an example of a unit for detecting the amount of particles.
Figure 12B:
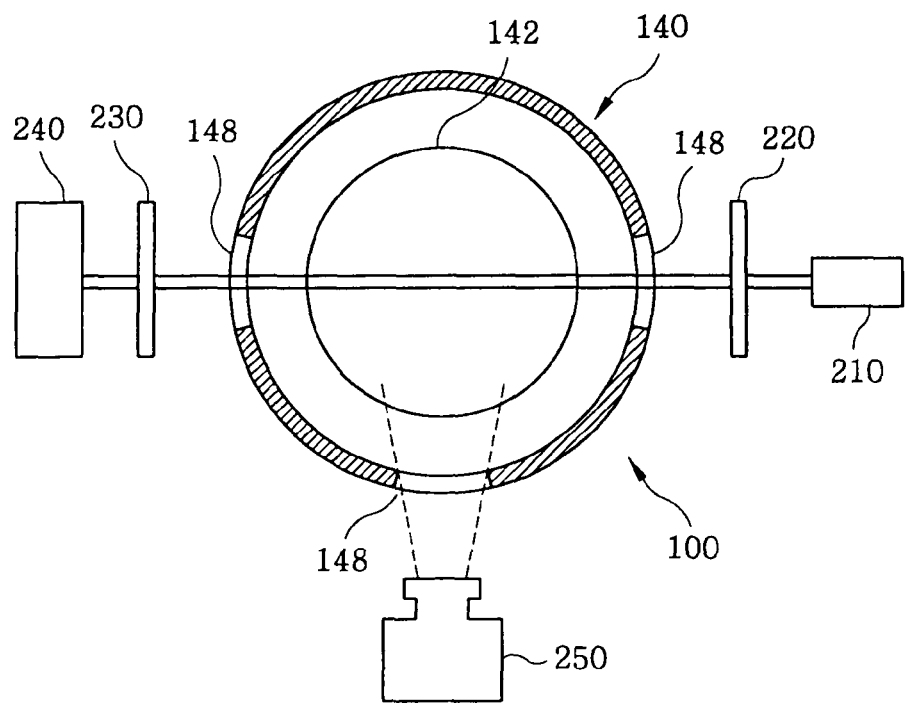

First, a unit for detecting the amount of particles, which is used in the present experiment, is described. FIGS. 12A and 12B are respectively a perspective view and a cross sectional view of an example of a unit for detecting the amount of particles provided in the processing chamber 140. As shown in FIG. 12A, the unit for detecting the amount of particles includes a laser light source 210 such as a laser light irradiating unit; slits 220 and 230; a light extinction device 240 for extinguishing the laser light from the laser light source 210; and a light receiving unit 250 such as CCD camera. Windows 148, formed of quartz, for transmitting light are disposed in a portion of the wall of the processing chamber 140. As shown in FIG. 12B, a pair of the windows 148 is disposed at positions such that they are aligned with the laser light penetrating through the processing chamber 140 from the laser light source 210 and a position where the light receiving unit 250 can receive light scattered by particles in the processing chamber 140.

The laser light from the laser light source 210 is illuminated into the processing chamber 140 through the slit 220 and one of the pair of the windows 148. Then, the laser light passes through the processing chamber 140 and is projected onto the light extinction device 240 through the other of the pair of the windows 148 and the slit 230. At this time, scattered light caused by particles is observed by the light receiving unit 250 via the other of windows 148.

Figure 13:
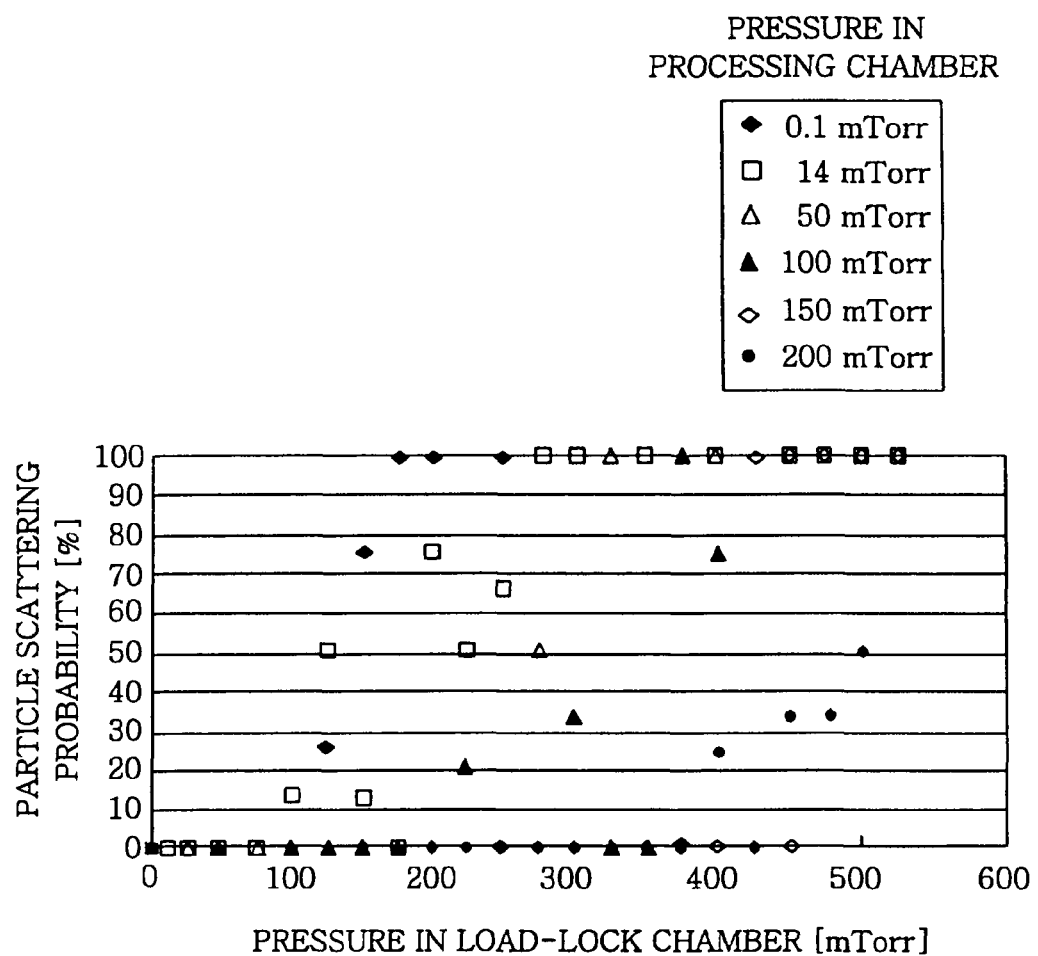
FIG. 13 shows a relationship between a pressure difference between chambers and particle scattering probability.

To perform an experiment by using the particle detecting device, particle powder is attached on the bottom surface of a gas feed unit 146 in the processing chamber 140 and the pressures of the load-lock chamber 150 and the processing chamber 140 are variously changed. Then, scattering of particles when the gate valve 144 is opened is observed by the light receiving unit 250 and scattering probability is examined by repeatedly performing the process multiple times. FIG. 13 shows the result of the experiment, that is, scattering probability of particles obtained by setting the pressure of the processing chamber 140 in a range disclosed in a right and upper column of FIG. 13 over respective pressures of the load-lock chamber 150. In FIG. 13, a horizontal axis stands for the pressure of the load-lock chamber 150 and a vertical axis represents scattering probability of particles.

Let the pressure of the processing chamber 140 shown in the right and upper column be P1 and the pressure of the load-lock chamber 150 on the horizontal axis be P2. According to the result of the experiment shown in FIG. 13, in case that P1 is 0.1 mTorr, the particles begin to scatter when P2 is about 125 mTorr, scattering probability increases in proportion as P2 rises, and the particles are scattering at a probability of 100% when P2 is more than about 175 mTorr. In case that P1 is 14 mTorr, the particles begin to scatter when P2 is about 100 mTorr, scattering probability increases in proportion as P2 rises, and the particles are scattering at a probability of 100% when P2 is more than about 275 mTorr.

Further, in case that P1 is 100 mTorr, the particles begin to scatter when P2 is about 225 mTorr, scattering probability increases in proportion as P2 rises, and the particles are scattering at a probability of 100% when P2 is more than about 450 mTorr. In case that P1 is 200 mTorr, the particles begin to scatter when P2 is about 400 mTorr, scattering probability increases in proportion as P2 rises, and the particles are scattering at a probability of 100% when P2 is more than about 525 mTorr.

From the results, the following conclusion can be obtained by the relations among a pressure difference between chambers, scattering probability, and respective pressures. When a pressure ratio of P2 to P1 (P2/P1) is equal to or larger than two, the particles begin to scatter and scattering probability increases in proportion as the pressure ratio rises. In the meantime, the smaller both P1 and P2 are, the more difficult the particles become to scatter. Further, when both P1 and P2 are not greater than approximately 100 mTorr, even though the pressure ratio is equal to or larger than two, the particles do not scatter.

The above-mentioned relation between a pressure difference between chambers and scattering of particles is not limited to the processing chamber 140 and the load-lock chamber 150, and can be similarly applied to other chambers having a pressure difference such as the load-lock chamber 150 and the transfer chamber 130.

As described above, when the gate valve is opened at the pressure ratio of 2 or more, a shock wave is generated to propagate into the chamber, whereby the particles are scattered in the chamber. This corresponds to a theory in which a shock wave occurs at the pressure ratio of 2 and the magnitude of the shock wave depends on the pressure ratio. On the contrary, when the pressure difference between the chambers is less than about 100 mTorr, even if the pressure ratio is 2 or more, the particles are not scattered.

Therefore, in the process of opening to atmosphere in the load-lock chamber 150 in accordance with the present invention, if timings of opening/closing the purge valve or the acid evacuation valve are controlled such that the pressure difference between the load-lock chamber 150 and the transfer chamber 130 is less than about 100 mTorr, the particles can be prevented from being swirled up when the gate valve is opened. Further, even though the pressure difference between the load-lock chamber 150 and the transfer chamber 130 is more than about 100 mTorr, if timings of opening/closing the purge valve or the acid evacuation valve are controlled such that the pressure ratio is less than two, the particles can be prevented from being swirled up along the shock wave.

Further, in the above embodiment, the present invention is applied to a case where opening/closing timings of the purge valve are controlled when the load-lock chamber 150 is opened to the atmosphere, but it is not limited to the load-lock chamber. That is, controlling of opening/closing timings of the purge valve in accordance with the present invention can be applied to a chamber where pressure control is performed by introducing thereto a purge gas such as $N_2$ gas before the gate valve is opened.

Further, the shock wave caused when the gate valve between the chambers is opened can be prevented by providing a shock wave preventing mechanism including Laval nozzle that will be described later.

(Example of Substrate Processing Apparatus Including Shock Wave Preventing Mechanism)

Figure 14:
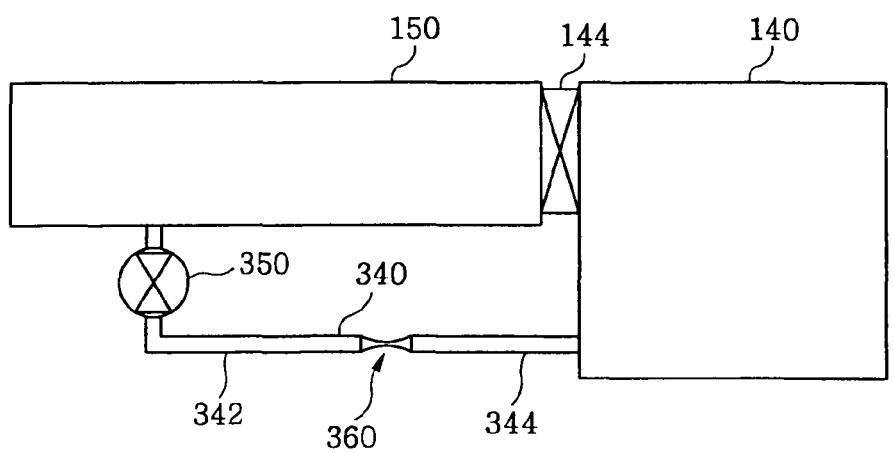
FIG. 14 shows a shock wave preventing mechanism provided between a load-lock chamber and a processing chamber.

Hereinafter, there will be described an example of a substrate processing apparatus including a shock wave preventing mechanism with reference to the drawings. FIG. 14 shows a shock wave preventing mechanism provided between the load-lock chamber 150 and the processing chamber 140 in the substrate processing apparatus shown in FIG. 1.

Specifically, the shock wave preventing mechanism shown in FIG. 14 is configured as follows. Installed between the load-lock chamber 150 and the processing chamber 140 is a communication pipe (bypass line) 340 which communicates with each of them. Further, disposed in the middle of the communication pipe 340 are a control valve 350 for opening or closing the communication pipe 340 and a shock wave propagation preventing unit 360 having a throttle. The shock wave propagation preventing unit 360 is for preventing propagation of a shock wave occurring when the communication pipe 340 is opened via the control valve 350. That is, the throttle included in the shock wave propagation preventing unit 360 can transform the shock wave into a standing wave to prevent the propagation.

In this case, the control valve 350 of the communication pipe 340 is disposed close to a chamber having a higher pressure, and the shock wave propagation preventing unit 360 is provided close to a chamber having a lower pressure. Accordingly, the propagation of the shock wave can be efficiently prevented because the shock wave occurs in the chamber having a lower pressure. When a corrosive gas such as HCl is used as a processing gas, generally, the pressure of the load-lock chamber 150 is made higher than that of the processing chamber 140 such that the corrosive gas does not enter the load-lock chamber 150. Thus, in the example shown in FIG. 14, the control valve 350 of the communication pipe 340 is disposed close to the load-lock chamber 150 in a line 342 of the communication pipe 340, and the shock wave propagation preventing unit 360 is provided close to the processing chamber 140 between lines 342 and 344 forming the communication pipe 340.

Figure 15:
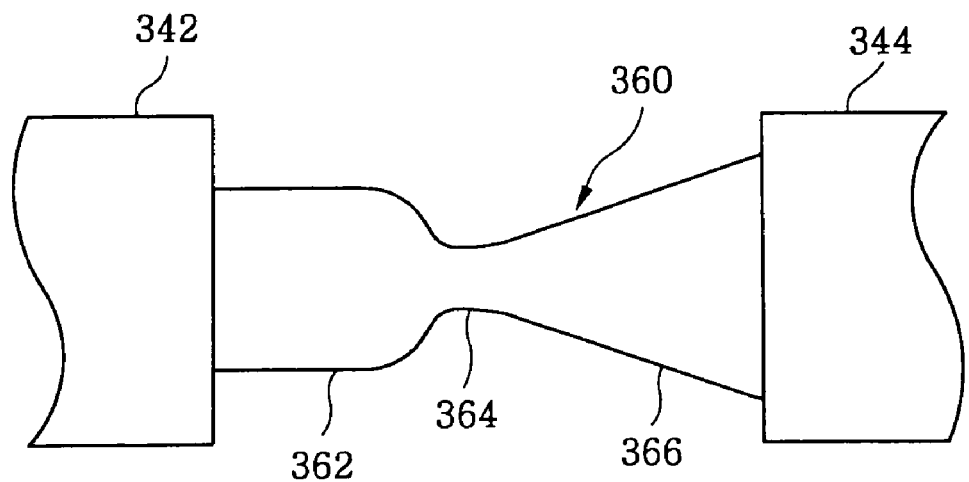
FIG. 15 shows a configuration of a Laval nozzle that is an example of a shock wave propagation preventing unit.
Figure 16:
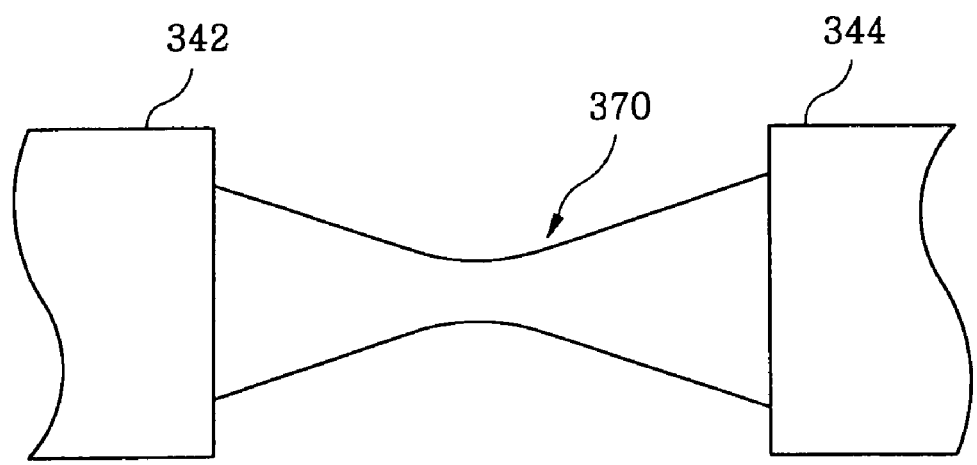
FIG. 16 shows a configuration of a Laval nozzle that is another example of a shock wave propagation preventing unit.

Something to prevent the propagation of the shock wave, e.g., a nozzle having a throttle, is available as the shock wave propagation preventing unit 360. For example, the shock wave propagation preventing unit 360 includes a Laval nozzle depicted in FIG. 15. The Laval nozzle has a throttle as shown in FIG. 15 and, specifically, includes a reduction part 362; a throat part 364; and an extension part 366. Further, as shown in FIG. 16, a shock wave propagation preventing unit 370 may be configured as a nozzle having a throttle and extension parts disposed at both sides of the throttle. In addition, the shock wave propagation preventing unit 360 is not limited to the above configuration. For example, it is possible to prevent the propagation of the shock wave by providing an orifice or a filter formed of porous ceramic, porous carbon or the like in the communication pipe 340.

In the substrate processing apparatus including the shock wave propagation preventing unit 360 shown in FIG. 14, the communication pipe 340 is opened by the control valve 350 before the gate valve 144. At this time, depending on a pressure difference between the processing chamber 140 and the load-lock chamber 150, a shock wave occurs in the communication pipe 340. However, the shock wave is transformed into a standing wave in the communication pipe 340 by the shock wave propagation preventing unit, e.g., the Laval nozzle. Accordingly, the shock wave can be prevented from propagating into the processing chamber 140 and particles can be prevented from being swirled up in the processing chamber 140.

Further, since the processing chamber 140 and the load-lock chamber 150 communicate with each other by opening the communication pipe 340, it is possible to sufficiently reduce the pressure difference between the processing chamber 140 and the load-lock chamber 150. Then, when the pressure difference between the processing chamber 140 and the load-lock chamber 150 is lowered to a value at which a shock wave does not occur, the gate valve 144 is opened. By doing this, even though the gate valve 144 is opened, a shock wave does not occur, whereby the particles can be definitely prevented from being swirled up along the shock wave.

As described above, by simply providing the communication pipe 340 including the shock wave propagation preventing unit 360 between the chambers, even if a shock wave occurs in the communication pipe 340, the shock wave can be transformed into a standing wave. Thus, when the communication pipe 340 is opened as well as when the gate valve 144 is opened, the particles can be effectively prevented from being swirled up along the shock wave. Further, in accordance with the substrate processing apparatus shown in FIG. 14, since a shock wave is prevented from propagating into the processing chamber 140 that can be easily contaminated with particles, it is possible to efficiently prevent a particle contamination to the substrate.

(Modified Example of Substrate Processing Apparatus Including Shock Wave Preventing Mechanism)

Figure 17:
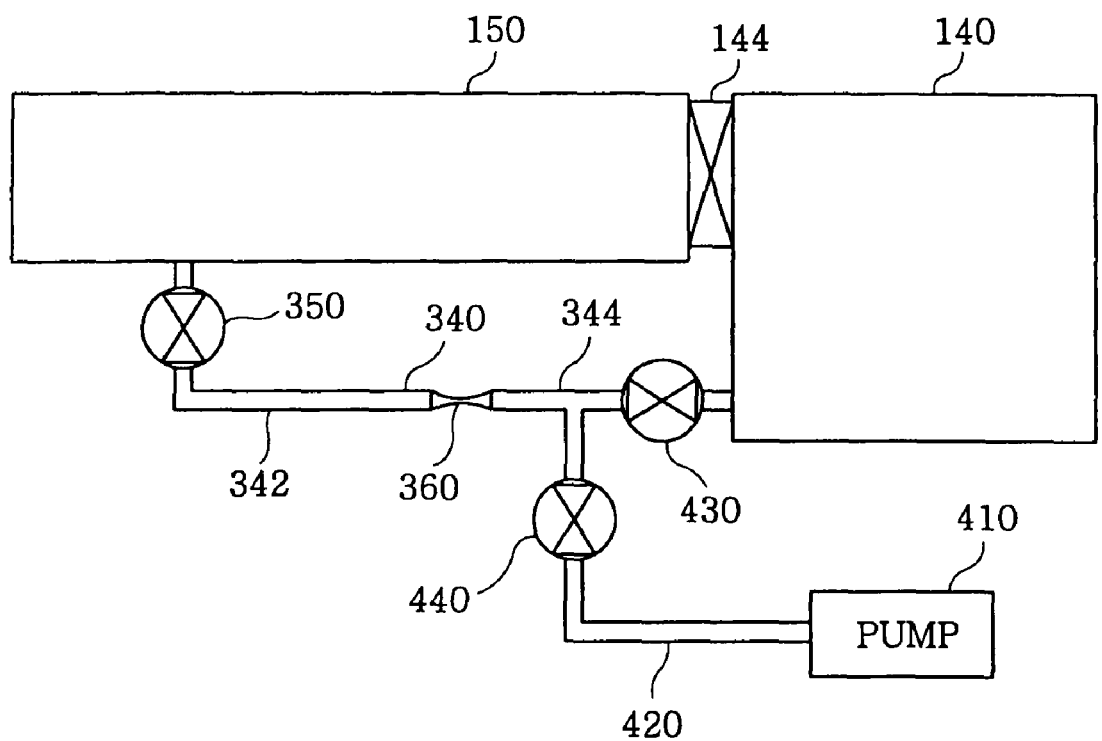
FIG. 17 schematically shows a configuration of a modified example of a substrate processing apparatus including a shock wave preventing mechanism.

Hereinafter, there will be described a modified example of a substrate processing apparatus including a shock wave preventing mechanism with reference to the drawings. FIG. 17 schematically shows a configuration of the modified example of the substrate processing apparatus including the shock wave preventing mechanism. Here, the shock wave preventing mechanism is applied to the substrate processing apparatus using a corrosive gas as a processing gas.

When a corrosive gas is employed as a processing gas in the processing chamber 140, a communication pipe 340 is configured as in FIG. 17 in order to protect the communication pipe 340 from the corrosive gas. That is, the communication pipe 340 is provided with a control valve 430 in a line 344 disposed between a shock wave propagation preventing unit 360 and the processing chamber 140 in addition to a control valve 350 disposed in a line 342. Further, in the middle of the line 344 of the communication pipe 340, a gas evacuation pipe 420 is connected between the shock wave propagation preventing unit 360 and the control valve 430. Moreover, the gas evacuation pipe 420 is provided with a control valve 440 and connected to a vacuum pump 410 such as a dry pump for evacuating the communication pipe 340 to vacuum.

In the substrate processing apparatus shown in FIG. 17, the following process is performed before the gate valve 144 is opened. First, when both of the control valves 350 and 430 are closed in the communication pipe 340, the communication pipe 340 is evacuated to vacuum by the vacuum pump 410. Accordingly, a processing gas remaining in the communication pipe 340 is evacuated. At this time, the pressure of the communication pipe 340 is made lower than that of the processing chamber 140.

Next, the control valve 430 close to the chamber having a lower pressure (the processing chamber 140 in the example shown in the FIG. 17) is opened. At this time, a shock wave may occur depending on a pressure difference between the communication pipe 340 and the processing chamber 140. However, since the communication pipe 340 previously evacuated to vacuum has a lower pressure than that of the processing chamber 140 and a shock wave occurs in the communication pipe 340, particles are prevented from being swirled up along the shock wave in the processing chamber 140 and the substrate is not contaminated. Further, because the control valve 350 close to the load-lock chamber 150 is closed, the shock wave generated when the control valve 430 is opened does not propagate into the load-lock chamber 150. Consequently, although the control valve 430 of the communication pipe 340 is opened, particles are prevented from being swirled up along the shock wave in the load-lock chamber 150.

Subsequently, the control valve 350 close to the load-lock chamber 150 is opened. At this time, a shock wave may occur in the communication pipe 340 close to the lock chamber 150 having a lower pressure depending on a pressure difference between the load-lock chamber 150 and the processing chamber 140. However, since the shock wave is transformed into a standing wave by the shock wave propagation preventing unit, for example, a Laval nozzle, the shock wave does not propagate into the processing chamber 140. Thus, particles are prevented from being swirled up along the shock wave in the processing chamber 140 and the substrate is not contaminated.

Further, since the magnitude of the shock wave is proportional to the pressure ratio of the chambers, it is preferable that the process is performed after respective pressures of the chambers are adjusted such that the pressure ratio of the chambers is not excessively high.

Further, the vacuum processing of the communication pipe 340 may be performed simultaneously when the processing chamber 140 is vacuum processed after the substrate is unloaded from the processing chamber 140 and the gate valve 144 is closed. In other words, if the control valve 430 close to the processing chamber 140 is opened while the processing chamber 140 is vacuum processed, the communication pipe 340 as well as the processing chamber 140 can be vacuum processed by the same vacuum pump for vacuum processing the processing chamber 140. Accordingly, it is also possible to eliminate the gas evacuation pipe 420 or the vacuum pump 410 for vacuum processing the communication pipe 340.

Moreover, in the examples shown in FIGS. 14 and 17, although the shock wave preventing mechanism is provided between the chambers having a pressure difference, i.e., the processing chamber 140 and the load-lock chamber 150, the present invention is not limited thereto, and the shock wave preventing mechanism may be provided between various types of chambers. For example, the shock wave preventing mechanism can be disposed between the load-lock chamber 150 and the transfer chamber 130.

(Substrate Processing Apparatus in Accordance with Another Embodiment)

Figure 18:
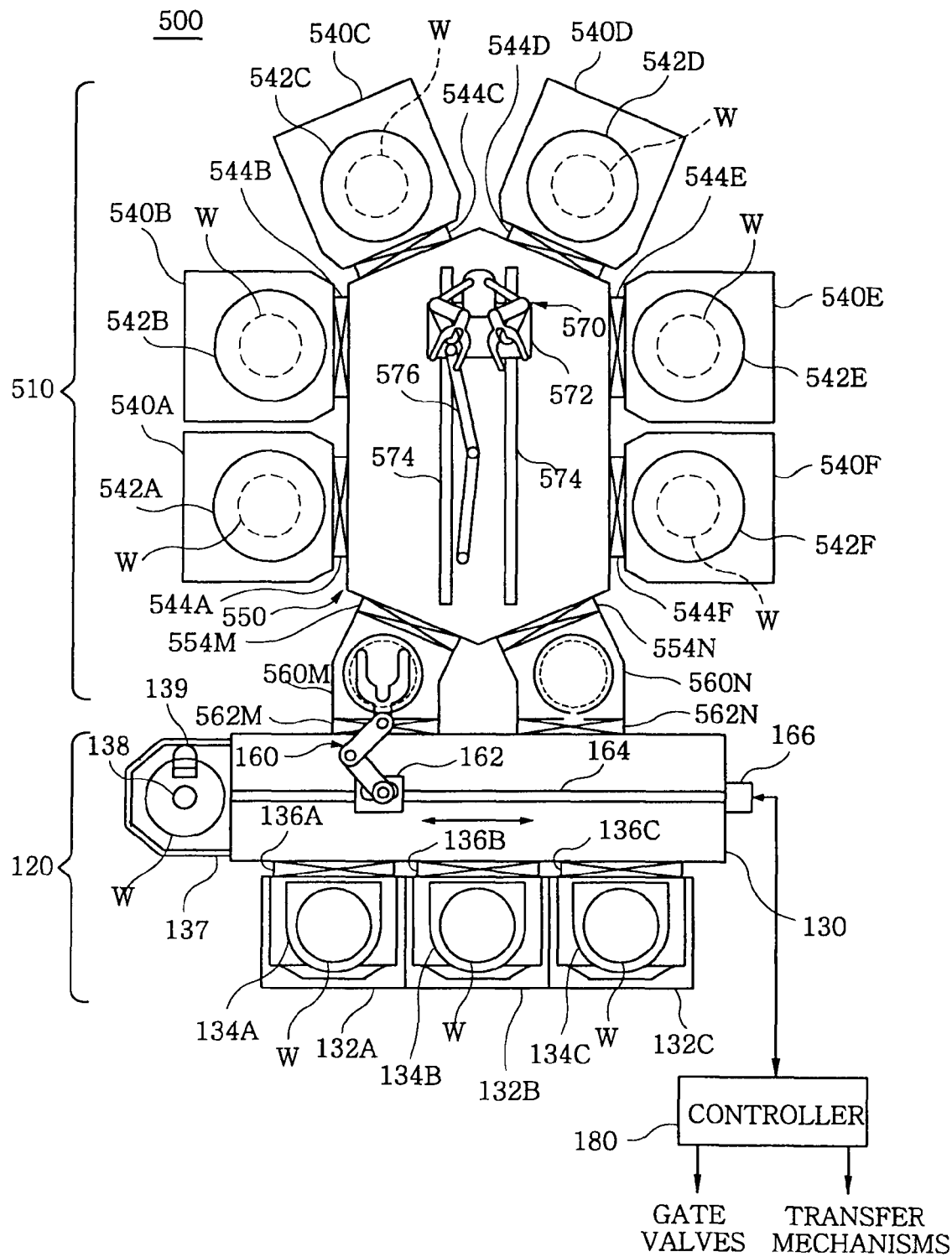
FIG. 18 shows a schematic configuration of a substrate processing apparatus provided with a vacuum processing unit including multiple chambers.

Hereinafter, there will be described a substrate processing apparatus in accordance with another embodiment of the present invention. For example, the present invention is not limited to the substrate processing apparatus shown in FIG. 1, and can be applied to various types of substrate processing apparatuses. FIG. 18 shows a schematic configuration of a substrate processing apparatus including a vacuum processing unit formed of multiple chambers.

The substrate processing apparatus 500 shown in FIG. 18 includes a vacuum processing unit 510 having multiple processing chambers 540 for performing various kinds of processes such as a film-forming process and an etching process on a substrate to be processed, e.g., semiconductor wafer W; and a transfer unit 120 for loading/unloading the wafer W into/from the vacuum processing unit 510. Because the transfer unit 120 has a same configuration as the one shown in FIG. 1, like reference numerals will be given to like parts and, further, a redundant description will be omitted. The transfer unit 120 shown in FIG. 18 includes a common transfer mechanism (atmospheric side transfer mechanism) 160 in a transfer chamber 130, and the common transfer mechanism 160 is configured as a single arm mechanism having one pick. A base 162 on which the common transfer mechanism 160 is fixed is slidably supported on a guide rail 164 disposed in a central portion of the transfer chamber 130 in a longitudinal direction thereof. Each of the base 162 and the guide rail 164 has a mover and a stator for a linear motor. A linear motor driving mechanism 166 for driving the linear motor is disposed at an end of the guide rail 164. The linear motor driving mechanism 166 is connected to a controller 180. Accordingly, based on control signals from the controller 180, the linear motor driving mechanism 166 is operated and the common transfer mechanism 160 and the base 162 move along the guide rail 164 in an arrow direction.

FIG. 18 shows the vacuum processing unit 510 having, e.g., six processing chambers 540A, 540B, 540C, 540D, 540E and 540F, wherein the vacuum processing unit 510 is disposed on the side of the transfer unit 120. The vacuum processing unit 510 includes a common transfer chamber 550 for loading/unloading the wafer W into/from the six processing chambers 540A to 540F. Further, the processing chambers 540A to 540F are arranged around the common transfer chamber 550 via gate valves 544A, 544B, 544C, 544D, 544E and 544F, respectively. Further, a first and a second load-lock chamber 560M and 560N capable of being vacuum processed are connected to the common transfer chamber 550 via gate valves 554M and 554N, respectively. Furthermore, the first and the second load-lock chamber 560M and 560N connected to the side of the transfer chamber 130 via the gate valves 562M and 562N, respectively.

In the aforementioned cluster tool type processing apparatus, the gate valves can be opened or closed airtightly between the common transfer chamber 550 and the six processing chambers 540A to 540F and between the common transfer chamber 550 and the load-lock chambers 560M and 560N to thereby communicate with each other when necessary. Further, the gate valves can be opened or closed airtightly between the transfer chamber 130 and the first and the second load-lock chamber 560M and 560N.

In the processing chambers 540A to 540F, a same process or different processes may be performed on the wafer W. Susceptors 542A, 542B, 542C, 542D, 542E and 542F for mounting thereon the wafer W are disposed in the processing chambers 540A to 540F, respectively. Further, the number of the processing chambers 540 is not limited to six and may be seven or more.

A pressure control is performed in the load-lock chambers 560M and 560N while the wafer W is temporarily supported therein and, then, the process moves onto the next step. The load-lock chambers 560M and 560N may be configured to also have a cooling mechanism or a heating mechanism. Further, gas piping of each of the load-lock chambers 560M and 560N is configured same as that shown in the FIG. 2.

A transfer mechanism (vacuum side transfer mechanism) 570 formed of, for example, a multi-joint arm capable of stretching, bending, elevating and revolving is disposed in the common transfer chamber 550. The transfer mechanism 570 is rotatably supported on a base 572. The base 572 is slidably supported on a guide rail 574, which is disposed from the front side to the back side in the common transfer chamber 550, for example, by an arm mechanism 576. Thus, it is possible to access the load-lock chambers 560M and 569N and the processing chambers 540A to 540F by sliding the transfer mechanism 570 along the guide rail 574. For example, when accessing the load-lock chambers 560M and 560N and the processing chambers 540A and 540F, the transfer mechanism 570 is moved along the guide rail 574 and positioned at the back side of the common transfer chamber 550. Further, when accessing the four processing chambers 540B to 540E, the transfer mechanism 570 is moved along the guide rail 574 and positioned at the front side of the common transfer chamber 550. Accordingly, it is possible to access all chambers connected to the common transfer chamber 550, i.e., the load-lock chambers 560M and 560N, and the processing chambers 540A to 540F, by only using the transfer mechanism 570. The transfer mechanism 570 has two picks so as to handle two wafers at the same time.

Further, the transfer mechanism 570 is not limited to the above configuration, and two transfer mechanisms may be provided. For example, a first and a second transfer mechanism, each having a multi-joint arm capable of stretching, bending, elevating and revolving, may be disposed at the back side and the front side in the common transfer chamber 550, respectively. Moreover, the number of the picks of the transfer mechanism 570 is not limited to two, and the transfer mechanism 570 may have just one pick.

When the gate valve 562M (562N) is opened between the transfer chamber 130 of the transfer unit 120 and the load-lock chamber 560M (560N) in the substrate processing apparatus 500 shown in FIG. 18, a process of opening to atmosphere is performed by introducing the purge gas into the load-lock chamber 560M (560N) in a same way as that in the substrate processing apparatus shown in FIG. 1. Thus, the process of opening to atmosphere shown in FIG. 5 or 9 in accordance with the present invention, wherein timings of closing the control valve (purge valve) V1 and opening the acid evacuation valve V8 can be freely set, can be applied to the process of opening to atmosphere in the load-lock chamber 560M (560N).

Therefore, it is prevented that the pressure of the load-lock chamber 560M (560N) becomes needlessly increased, thereby preventing particles from being swirled up in the load-lock chamber 560M (560N). Further, the processing gas such as corrosive gas remaining in the load-lock chamber 560M (560N) can be evacuated in advance before the gate valve 562M (562N) is opened.

Further, when one of the gate valves 544A to 544F is opened between the common transfer chamber 550 and a corresponding one of the processing chambers 540A to 540F, the purge gas is introduced into the common transfer chamber 550 in order to prevent the processing gas such as corrosive gas from flowing into the common transfer chamber 550 from the corresponding one of the processing chambers 540A to 540F. Thus, the pressure of the common transfer chamber 550 is usually made higher than that of each of the processing chambers 540A to 540F. Since there exists a pressure difference between the common transfer chamber 550 and each of the processing chambers 540A to 540F, a shock wave can be generated depending on the pressure difference to make particles be swirled up. Therefore, a shock wave preventing mechanism similar to the one shown in FIG. 14 or 17 is provided between the common transfer chamber 550 and each of the processing chambers 540A to 540F, whereby particles are certainly prevented from being swirled up as in the substrate processing apparatus 100 shown in FIG. 1.

(Self-Check Process of Chamber)

In respective chambers, for example, the processing chambers 140 and 540 and the load-lock chambers 150 and 560 shown in FIGS. 1 and 18, a self-check process may be performed for the purpose of improving operating efficiency for regular maintenance and shortening operating time. In the self-check process, a vacuum system for performing a vacuum processing (evacuating) by using a vacuum pump and a gas system for supplying a specified gas such as processing gas or purge gas are checked.

Figure 19:
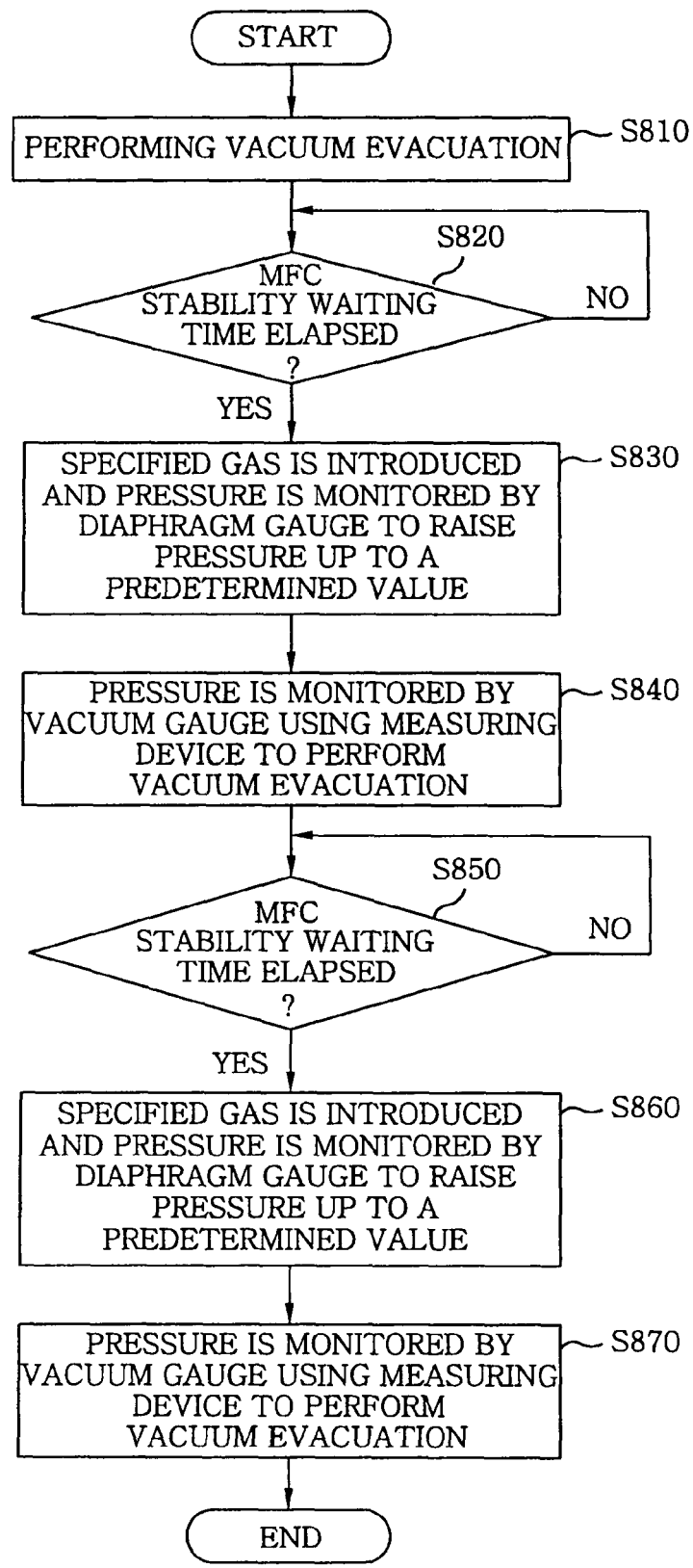
FIG. 19 is a flowchart showing a general example of a self-check process in the processing chamber.

Such a self-check process will be described in detail with reference to the drawings. FIG. 19 is a flowchart showing a general example of the self-check process in the processing chambers 140 and 540. First, a vacuum processing is performed by the vacuum system at step S810. For a vacuum evacuation valve is opened and the processing chambers 140 and 540 are vacuum processed by operating the vacuum pump. Then, at step S820, it waits until a mass flow controller (MFC) that is disposed in, e.g., a processing gas introduction pipe of the gas system is stabilized.

Then, if it is determined that the MFC stability waiting time has elapsed at step S820, the process proceeds to step S830 where a specified gas (e.g., processing gas in the self-check process of the processing chamber 140 or 540) is introduced and while a pressure is monitored by a diaphragm vacuum gauge, e.g., a capacitance manometer, disposed in the processing chamber 140 or 540, the pressure is raised up to a predetermined value (build up). As described above, when the processing gas is introduced, the pressure is monitored by the diaphragm vacuum gauge capable of extensively measuring the pressure. The diaphragm vacuum gauge employing a thin metal film can measure pressures ranging from $10^{-4}$ Torr to $10^2$ Torr by detecting a change in a electrostatic capacitance. In the diaphragm vacuum gauge, for example, an inner space of its container is divided into two portions by the thin metal film, wherein one portion is sealed to vacuum and the other portion communicates with the processing chamber.

Subsequently, at step S840, while the pressure is monitored by a vacuum gauge employing a measuring device disposed in a vacuum evacuation pipe, e.g., a Convectron gauge, a vacuum processing is performed. Here, since the vacuum processing is performed, the pressure is measured by the vacuum gauge disposed in a vacuum evacuation pipe. As the vacuum gauge employing a measuring device, there are a Pirani vacuum gauge, a quartz friction vacuum gauge and the like in addition to the above-mentioned Convectron vacuum gauge. The Convectron vacuum gauge or Pirani vacuum gauge can measure pressures generally ranging from $10^{-3}$ Torr to 1 Torr by detecting a temperature change in the measuring device formed of fine platinum lines, i.e., a change in an electric resistance. Further, the quartz friction vacuum gauge can measure pressures generally ranging from $10^{-2}$ Torr to $10^3$ Torr by detecting a variation in a resonance state of a tuning fork shaped quartz oscillator. As the quartz friction vacuum gauge, for example, there is a crystal gauge that is a hybrid vacuum gauge combining the quartz friction vacuum gauge with a B-A type ionization vacuum gauge. The vacuum gauge employing the measuring device features that the pressure is measured by exposing the measuring device to gas.

Next, sequential steps S850, S860 and S870 are executed similarly to the way steps S820, S830 and S840 are executed and a whole self-check process is finished.

As described above, in the self-check process shown in FIG. 19, the pressure is monitored by using the diaphragm vacuum gauge when the processing gas is introduced (build up) at steps S830 and S860, whereas the pressure is monitored by a vacuum gauge employing a measuring device disposed in a vacuum evacuation pipe when vacuum processing at steps S840 and S870.

The vacuum gauge employing the measuring device measures the pressure by directly exposing the measuring device to the processing gas flowing in the vacuum evacuation pipe unlike the diaphragm vacuum gauge. Thus, the longer time the measuring device is exposed to the processing gas, the higher the probability for the malfunction or wearing down in the vacuum gauge employing the measuring device becomes compared to the diaphragm vacuum gauge. Accordingly, as shown in FIG. 19, if the vacuum gauge employing the measuring device is used even for the self-check process different in addition to an actual substrate processing, the vacuum gauge may break down more frequently, thereby shortening its life span.

Further, a pressure range where the vacuum gauge employing the measuring device can measure pressure is included in a pressure range where the diaphragm vacuum gauge can measure pressure. Specifically, the vacuum gauge employing the measuring device such as the Convectron vacuum gauge or Pirani vacuum gauge can measure pressure ranging from $10^{-3}$ Torr to 1 Torr, and the quartz friction vacuum gauge can measure pressure ranging from $10^{-2}$ Torr to $10^3$ Torr. Thus, a measurement range of those gauges is included in a measurement range, $10^{-4}$ Torr to $10^3$ Torr, of the diaphragm vacuum gauge such as a capacitance manometer. Accordingly, the diaphragm vacuum gauge can be used instead of the vacuum gauge employing the measuring device.

Therefore, in the self-check process, the diaphragm vacuum gauge such as the capacitance manometer is used instead of the vacuum gauge employing the measuring device, whereby the malfunction or wearing down is prevented from occurring in the vacuum gauge employing the measuring device.

Figure 20:
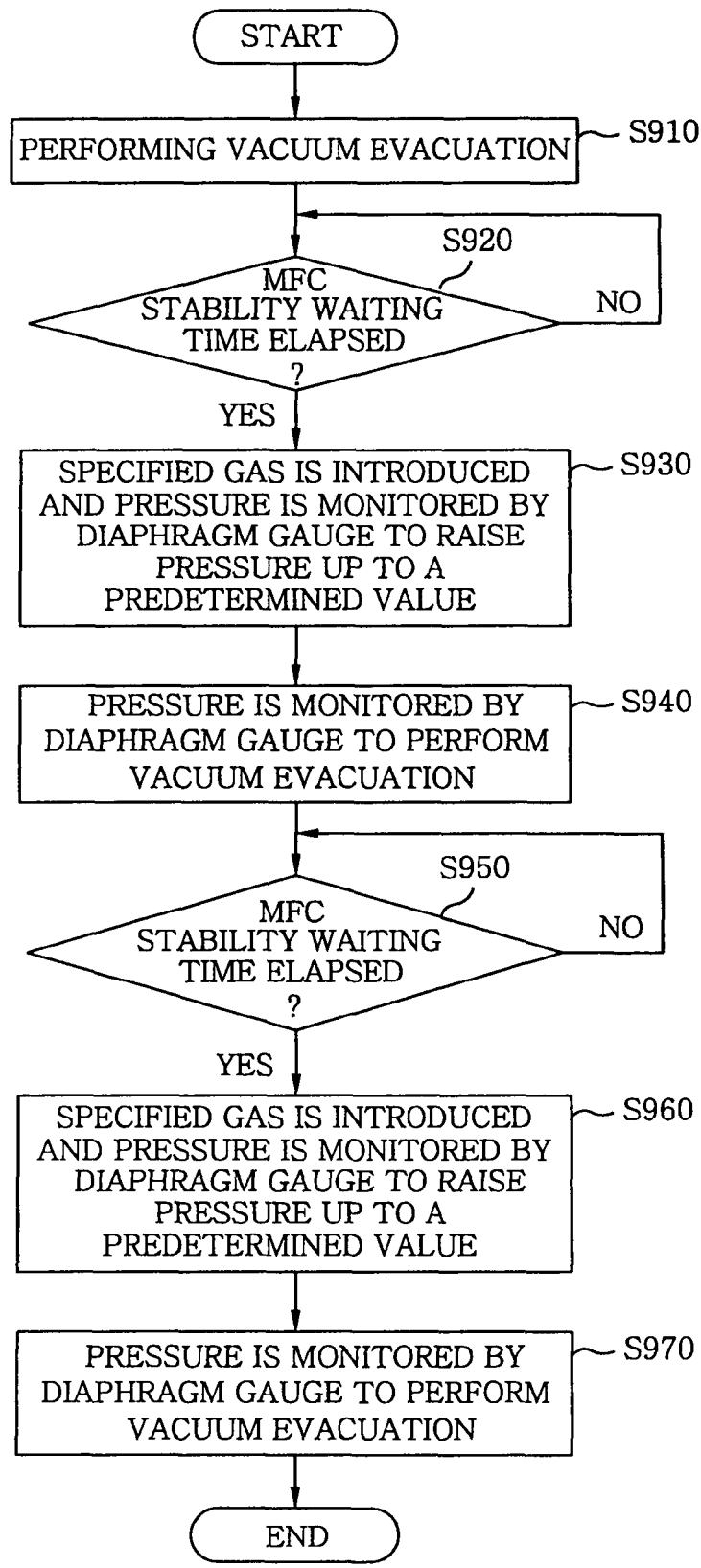
FIG. 20 shows an example of a self-check process in which the vacuum gauge employing the measuring device is not used.

FIG. 20 shows an example of the self-check process in which the vacuum gauge employing the measuring device is not used. First, a vacuum processing is performed by the vacuum system at step S910. Then, at step S920, it waits until a mass flow controller (MFC) that is disposed in, e.g., a processing gas introduction pipe of the gas system is stabilized. Then, if it is determined that the MFC stability waiting time has elapsed at step S920, the process proceeds to step S930 where a specified gas (e.g., processing gas in the self-check process of the processing chamber 140 or 540) is introduced and while a pressure is monitored by a diaphragm vacuum gauge, e.g., a capacitance manometer, disposed in the processing chamber 140 or 540, the pressure is raised up to a predetermined value (build up). Steps S910~S930 are executed similarly to steps S810~S830 shown in FIG. 19.

Subsequently, at step S940, while the pressure is monitored by the diaphragm vacuum gauge (e.g., a capacitance manometer), a vacuum processing is performed by the vacuum system. At this time, when there is provided the vacuum gauge employing a measuring device (e.g., a Convectron vacuum gauge, a Pirani vacuum gauge, a quartz friction vacuum gauge), its protection valve is closed to prevent the processing gas such as corrosive gas from entering the vacuum system.

Next, sequential steps S950, S960 and 5970 are executed similarly to steps S920, S930 and S940 and a whole self-check process is finished.

As described above, in the self-check process shown in FIG. 20, the pressure is monitored by using the diaphragm vacuum gauge (e.g., a capacitance manometer) when vacuum processing at steps S940 and S970 as well as when the processing gas is introduced (build up) at steps S930 and S960. As described above, the self-check process is performed without using the vacuum gauge employing a measuring device (e.g., Convectron vacuum gauge, Pirani vacuum gauge, a quartz friction vacuum gauge) to thereby reduce the probability for malfunction of the vacuum gauge employing a measuring device and extend its life span.

While the invention has been shown and described with respect to the preferred embodiments, it will be understood by those skilled in the art that various changes and modifications may be without departing from the spirit and scope of the invention as defined in the following claims.

What is claimed is:

1. A substrate processing apparatus, comprising:
   a transfer unit for transferring a substrate to be processed between chambers accommodating therein the substrate;
   at least one vacuum processing unit connected to the transfer unit and including at least one vacuum preparation chamber and at least one vacuum processing chamber, wherein said at least one vacuum preparation chamber is connected to the transfer unit via a gate valve and has a nonreactive gas introducing unit, a corrosive gas evacuation unit and an opening-to-atmosphere unit, and wherein said at least one vacuum processing chamber is configured to perform a process on the substrate loaded therein via the vacuum preparation chamber by using a corrosive gas as a processing gas; and
   a controller configured to:
      introduce a nonreactive gas into the vacuum preparation chamber by controlling a gas introduction valve of the nonreactive gas introducing unit before the gate valve is opened for substrate transfer between the vacuum preparation chamber of the vacuum processing unit and the transfer unit;
      stop introducing the nonreactive gas by controlling the gas introduction valve of the nonreactive gas introducing unit when the controller determines that an inner pressure of the vacuum preparation chamber becomes equal to an atmospheric pressure, start an evacuation process of a corrosive gas in the vacuum preparation chamber by controlling an evacuation valve of the corrosive gas evacuation unit and then open to atmosphere performed by letting the vacuum preparation chamber communicate with an atmosphere by controlling an opening-to-atmosphere valve of the opening-to-atmosphere unit; and
      open the gate valve after the step of opening to atmosphere.

2. The substrate processing apparatus of claim 1, wherein timings of stopping introducing the nonreactive gas and starting the evacuation process of the corrosive gas are freely set by the controller.

3. The substrate processing apparatus of claim 2, wherein timings of stopping introducing the nonreactive gas and starting the evacuation process of the corrosive gas are equal to a timing when the inner pressure of the vacuum preparation chamber becomes same as the atmospheric pressure by the controller.

4. The substrate processing apparatus of claim 1, wherein the corrosive gas evacuation unit includes a backflow detecting unit for detecting a backflow in the evacuation process, and
   when the backflow is detected in the evacuation process by the backflow detecting unit after opening the evacuation valve of the corrosive gas evacuation unit, the controller performs an error process if the backflow is not controlled within a specified time period and the controller does not perform the error process if the backflow is controlled within a specified time period.

5. The substrate processing apparatus of claim 1, wherein a shock wave preventing mechanism for preventing a shock wave occurring depending on a pressure difference between the vacuum preparation chamber and the transfer unit is provided therebetween.

6. The substrate processing apparatus of claim 5, wherein the shock wave preventing mechanism includes:
   a communication pipe for letting the vacuum preparation chamber communicate with the transfer unit or the vacuum processing chamber;
   a shock wave propagation preventing unit disposed in the communication pipe; and
   a communication pipe opening/closing valve disposed at one side of the shock wave propagation preventing unit, close to the vacuum preparation chamber having a higher pressure.

7. The substrate processing apparatus of claim 1, wherein a shock wave preventing mechanism for preventing a shock wave occurring depending on a pressure difference between the vacuum preparation chamber and the vacuum processing chamber is provided therebetween.

* * * * *

UNITED STATES PATENT AND TRADEMARK OFFICE
CERTIFICATE OF CORRECTION

| | |
|---|---|
| PATENT NO. | : 8,172,949 B2 |
| APPLICATION NO. | : 12/718699 |
| DATED | : May 8, 2012 |
| INVENTOR(S) | : Tomoyuki Kudo et al. |

Page 1 of 1

It is certified that error appears in the above-identified patent and that said Letters Patent is hereby corrected as shown below:

In column 29, line 31, after "For" insert --instance,--.

In column 31, line 7, change "5970" to --S970--.

Signed and Sealed this
Twenty-eighth Day of August, 2012

David J. Kappos
*Director of the United States Patent and Trademark Office*